United States Patent
Jacques et al.

(10) Patent No.: US 9,501,611 B2
(45) Date of Patent: Nov. 22, 2016

(54) METHOD AND SYSTEM FOR CUSTOMIZING A RECORDED REAL TIME SIMULATION BASED ON SIMULATION METADATA

(71) Applicant: CAE INC., Saint-Laurent (CA)

(72) Inventors: Francis Jacques, Laval (CA); Sebastien Mouton, Montreal (CA); Mohammed Khan, Pincourt (CA)

(73) Assignee: CAE Inc, Saint-Laurent (CA)

( * ) Notice: Subject to any disclaimer, the term of this patent is extended or adjusted under 35 U.S.C. 154(b) by 7 days.

(21) Appl. No.: 14/672,588

(22) Filed: Mar. 30, 2015

(65) Prior Publication Data

US 2016/0292351 A1  Oct. 6, 2016

(51) Int. Cl.
G06F 17/50  (2006.01)

(52) U.S. Cl.
CPC ....... *G06F 17/5095* (2013.01); *G06F 17/5009* (2013.01)

(58) Field of Classification Search
USPC ......... 703/2, 6; 709/212; 705/26, 7.42; 434/30, 38; 455/412
See application file for complete search history.

(56) References Cited

U.S. PATENT DOCUMENTS

| | | | |
|---|---|---|---|
| 5,745,738 A | 4/1998 | Ricard | |
| 6,152,856 A | 11/2000 | Studor et al. | |
| 7,043,193 B1 | 5/2006 | Vashi et al. | |
| 7,788,080 B2 | 8/2010 | Graham et al. | |
| 8,081,921 B2 | 12/2011 | Batcheller et al. | |
| 8,346,646 B2 * | 1/2013 | Cutler | G06F 3/0481 705/36 R |
| 2002/0091658 A1 | 7/2002 | Bae | |
| 2004/0175684 A1 | 9/2004 | Kaasa et al. | |
| 2006/0105299 A1 | 5/2006 | Ferris et al. | |
| 2008/0124694 A1 | 5/2008 | Miller et al. | |
| 2010/0285438 A1 * | 11/2010 | Kesavadas | A61B 17/00234 434/262 |
| 2013/0196601 A1 * | 8/2013 | Bobrow | H04B 7/24 455/41.2 |
| 2014/0278833 A1 * | 9/2014 | Swanson | G06Q 10/06398 705/7.42 |
| 2014/0370816 A1 * | 12/2014 | Bobrow | H04B 7/24 455/41.2 |
| 2015/0050623 A1 * | 2/2015 | Falash | G09B 9/24 434/38 |
| 2015/0058175 A1 * | 2/2015 | Axt | H04N 21/44204 705/26.81 |
| 2015/0079545 A1 * | 3/2015 | Kurtz | G06F 21/32 434/30 |
| 2015/0088829 A1 * | 3/2015 | Alanis | G06F 11/1451 707/639 |
| 2015/0089011 A1 * | 3/2015 | Alanis | G06F 11/1451 709/212 |
| 2015/0161904 A1 | 6/2015 | Beck et al. | |
| 2015/0258438 A1 * | 9/2015 | Tait | H04L 67/42 463/31 |

FOREIGN PATENT DOCUMENTS

| | | |
|---|---|---|
| CA | 1292573 | 11/1991 |
| WO | 2012158432 A9 | 11/2012 |

* cited by examiner

*Primary Examiner* — Thai Phan

(57) ABSTRACT

Method and system for automatically customizing a recorded real time simulation based on simulation metadata. Recorded data corresponding to the real time simulation are received by the computing device. The recorded data are organized according to an original simulation timeline. The recorded data are processed by the computing device to generate customized simulation data based on the simulation metadata. The customized simulation data are organized according to an updated simulation timeline. The updated simulation timeline is generated based on the original simulation timeline. For instance, a new datum corresponding to a plurality of recorded data is generated according to the simulation metadata. The recorded data may comprise an action performed by a user interacting with the real time simulation, an event occurring during the real time simulation, a variation of a parameter during the real time simulation, and a screenshot of a display of the real time simulation.

18 Claims, 20 Drawing Sheets

METHOD AND SYSTEM FOR CUSTOMIZING A RECORDED REAL TIME SIMULATION BASED ON SIMULATION METADATA

TECHNICAL FIELD

The present disclosure relates to the field of training of crews of vehicles such as aircrafts. More specifically, the present disclosure relates to a method, computer program product and system for customizing a recorded real time simulation based on simulation metadata.

BACKGROUND

Simulators are used to practice complex and potentially dangerous tasks in a realistic and secure environment. For instance, flight simulators are used by commercial airlines and air forces to train their pilots to face various types of situations. Practicing on a flight simulator is also usually less costly than practicing on a real aircraft.

However, practicing on a real time simulator requires a minimum level of training, and may still be too costly for trainees who just started to acquire the appropriate skills. These trainees are generally trained with more traditional training material, such as formal presentations in classrooms, instruction manuals, videos, etc. This type of traditional training material is mainly theoretical, and lacks the level of interactivity offered by a simulator. Furthermore, it fails to put the trainees in situations close to what could be experienced in real life, where they have to take decisions when particular operating conditions arise. There is therefore a need for generating an interactive training scenario based on a recorded real time simulation.

Furthermore, the recorded data corresponding to the real time simulation may not be sufficiently adapted to the generation of the interactive training scenario. In this case, the generation of the interactive training scenario involves complex and time consuming interactions of a user for manually adapting the recorded data.

There is therefore also a need for a method, computer program product and system for automatically customizing a recorded real time simulation based on simulation metadata.

SUMMARY

According to a first aspect, the present disclosure provides a method for customizing a recorded real time simulation based on simulation metadata. The method comprises recording data corresponding to the real time simulation. The recorded data are organized according to an original simulation timeline. The method further comprises processing, by a processing unit of a computing device, the recorded data to generate customized simulation data based on the simulation metadata. The customized simulation data are organized according to an updated simulation timeline. The updated simulation timeline is generated based on the original simulation timeline.

According to a second aspect, the present disclosure provides a computer program product comprising instructions deliverable via an electronically-readable media, such as storage media and communication links. The instructions comprised in the computer program product, when executed by a processing unit of a computing device, provide for customizing a recorded real time simulation based on simulation metadata, according to the aforementioned method.

According to a third aspect, the present disclosure provides a system for customizing a recorded real time simulation based on simulation metadata. The system comprises a computing device. The computing device comprises memory for storing the simulation metadata. The computing device comprises a processing unit for receiving recorded data corresponding to the real time simulation. The recorded data are organized according to an original simulation timeline. The processing unit further processes the recorded data to generate customized simulation data based on the simulation metadata. The customized simulation data are organized according to an updated simulation timeline. The updated simulation timeline is generated based on the original simulation timeline.

BRIEF DESCRIPTION OF THE DRAWINGS

Embodiments of the disclosure will be described by way of example only with reference to the accompanying drawings, in which.

DETAILED DESCRIPTION

The foregoing and other features will become more apparent upon reading of the following non-restrictive description of illustrative embodiments thereof, given by way of example only with reference to the accompanying drawings. Like numerals represent like features on the various drawings.

Various aspects of the present disclosure generally address one or more of the problems related to the generation of an interactive scenario for training crews of a vehicle such as an aircraft, using data recorded from a real time simulation of the vehicle for generating the scenario.

Figure 1:
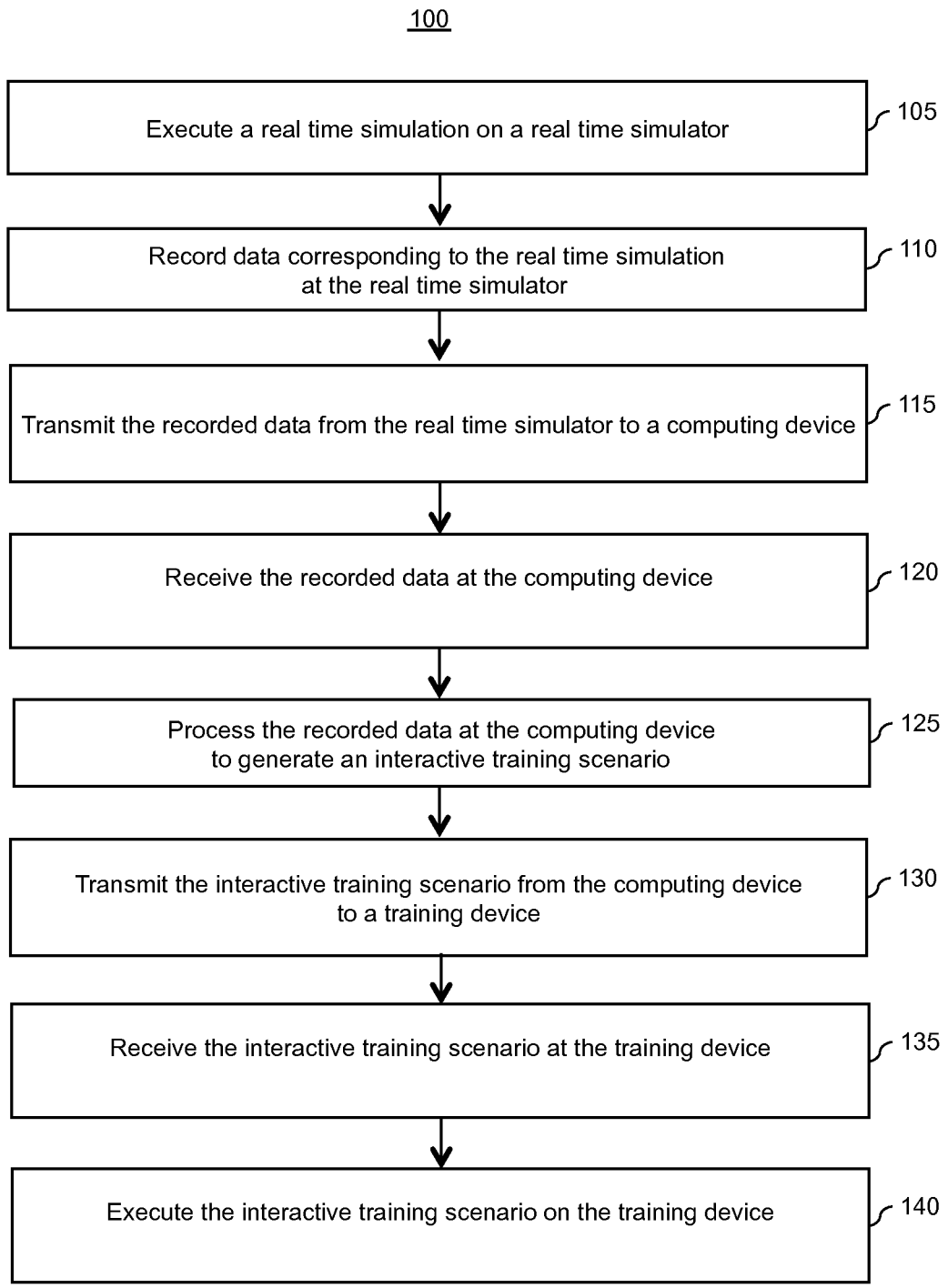
FIG. 1 illustrates a method for generating an interactive training scenario based on a recorded real time simulation.
Figure 2:
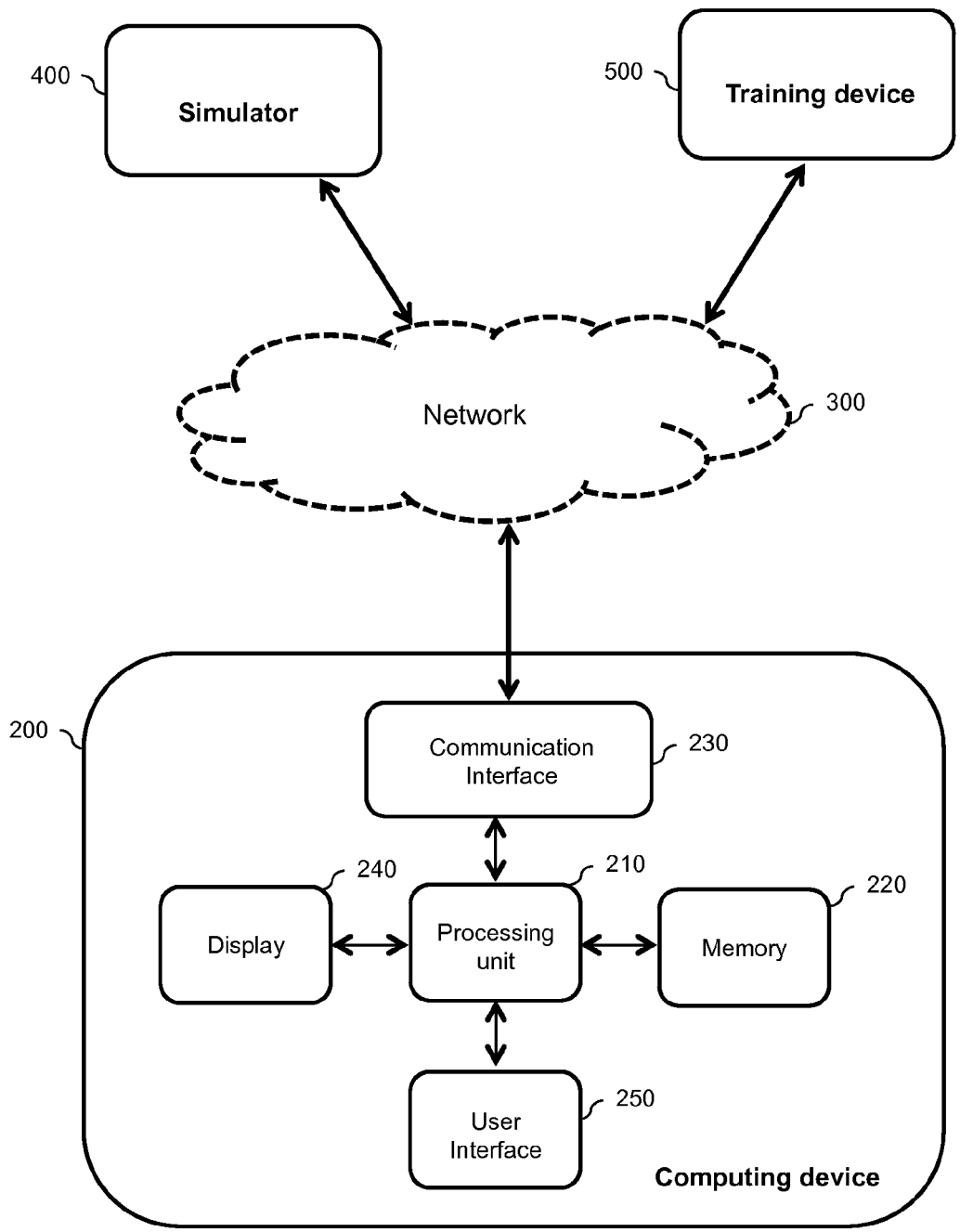
FIG. 2 illustrates a system comprising a computing device for implementing the method of FIG. 1.

Referring now concurrently to FIGS. 1 and 2, a method 100 and a system for generating and executing an interactive training scenario based on recorded data of a real time simulation are represented. The system comprises a computing device 200, and may include a training device 500.

Steps of the method 100 are performed by the computing device 200 for generating the interactive training scenario based on the recorded data of the real time simulation. Some steps of the method 100 are performed by a simulator 400 (represented in FIG. 2) for executing the real time simulation and recording data of the real time simulation. Some other steps of the method are performed by the training device 500 (represented in FIG. 2) for executing the interactive training scenario.

The computing device 200 comprises a processing unit 210, having one or more processors (not represented in FIG. 2 for simplification purposes) capable of executing instructions of computer program(s). Each processor may further have one or several cores.

The computing device 200 comprises memory 220 for storing instructions of the computer program(s) executed by the processing unit 210, data generated by the execution of the computer program(s), data received via a communication interface 230, etc. The computing device 200 may comprise several types of memories, including volatile memory, non-volatile memory, etc.

The computing device 200 comprises the communication interface 230, for exchanging data with other entities, such as the simulator 400 and the training device 500. The computing device 200 exchange data with the other entities through communication links, generally referred to as the network 300 (e.g. the Internet or an Intranet) for simplification purposes. Such communication links may include wired communication links (e.g. an Ethernet network, etc.) and wireless communication links (e.g. a Wi-Fi network, a cellular network, etc.).

The computing device 200 comprises at least one display 240 (e.g. a regular screen or a tactile screen) for displaying data processed and/or generated by the processing unit 210 when performing the method 100.

The computing device 200 comprises at least one user interface 250 (e.g. a mouse, a keyboard, a trackpad, a touchscreen, etc.) for allowing a user to interact with the computing device 200 when performing the method 100.

In the rest of the description, we refer to instructions of a specific computer program. The instructions of the specific computer program implement the steps of the method 100 executed by the processing unit 210 of the computing device 200. The instructions are comprised in a computer program product (e.g. memory 220). The instructions are provided for generating an interactive training scenario based on a recorded real time simulation, when executed by the processing unit 210 of the computing device 200. The instructions of the computer program product are deliverable via an electronically-readable media, such as a storage media (e.g. a USB key or a CD-ROM) or the network 300 (through the communication interface 230 of the computing device 200).

The computing device 200 can be implemented by a dedicated computer or server, such as a classroom instructor tool or station, a build station, etc. Alternatively, the computing device 200 may be implemented by a laptop or a tablet with a processing unit 210 having for instance sufficient computing power (and a memory 220 having sufficient capacity) for implementing the steps of the method 100 performed by the processing unit 210. In still another alternative, a laptop or a tablet provides the display 240 and the user interface(s) 250 of the computing device 200, and communicates with a dedicated computer or server of a cloud computing environment. The dedicated computer or server provides the processing unit 210, memory 220 and communication interface 230 of the computing device 200.

Figure 3:
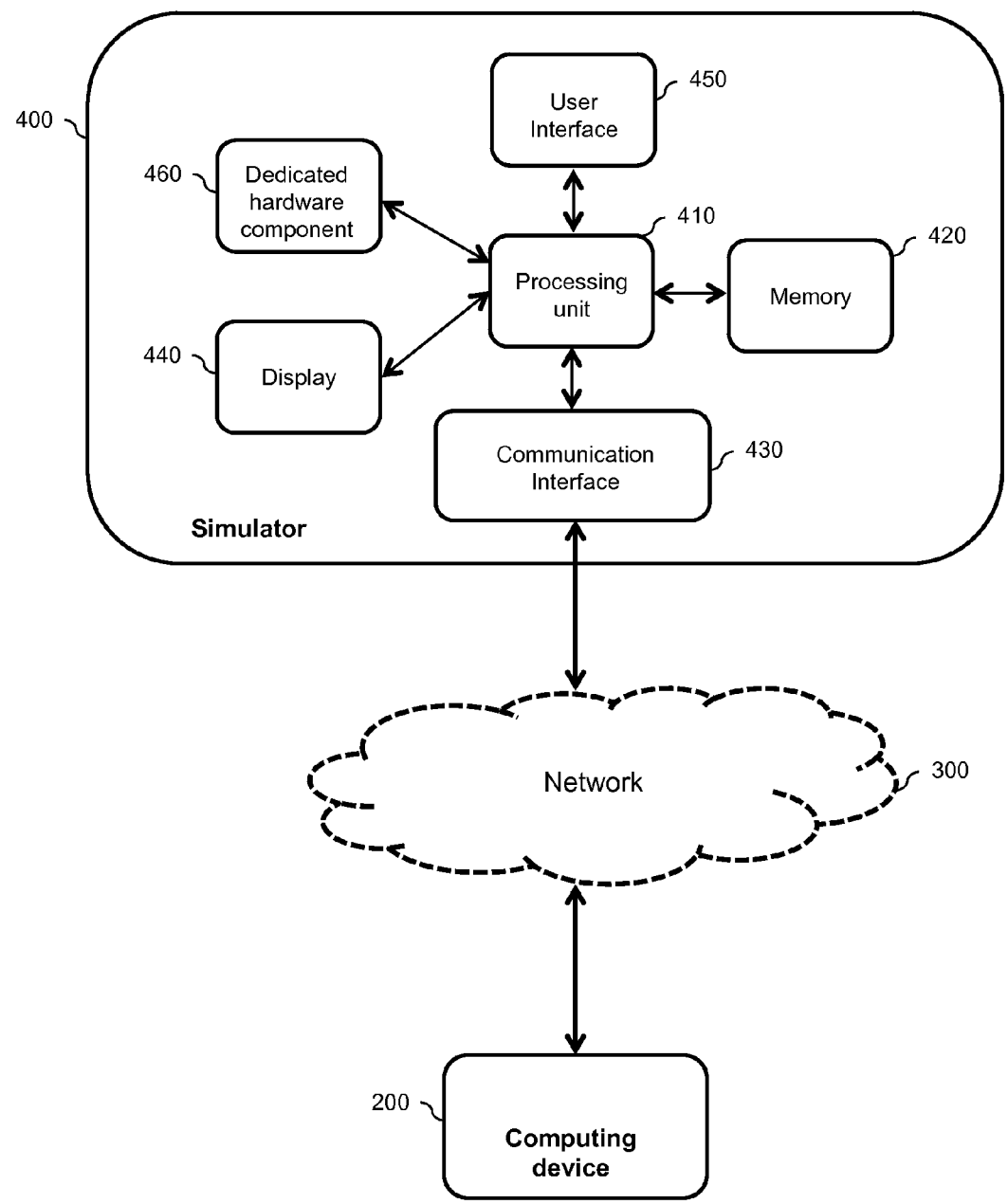
FIG. 3 illustrates details of a simulator represented in FIG. 2.

Referring now to FIG. 3, details of the simulator 400 are represented. In a preferred embodiment, the simulator 400 is a real time simulator, capable of executing a real time simulation of a vehicle. Vehicles which can be simulated include aircrafts, drones, terrestrial vehicles such as tanks, maritime vehicles such as boats, etc. For example, a flight simulator is used by commercial airlines and air forces to train their pilots to face various types of situations, when operating a particular type of aircraft simulated in real time by the flight simulator. The simulator 400 may also perform a real time simulation of an underground system, a mining facility, a nuclear plant, etc. The simulator 400 generates real time simulation data which are recorded at the simulator 400, and transmitted to the computing device 200.

The simulator 400 comprises a processing unit 410, having one or more processors capable of executing instructions of computer program(s) for executing the real time simulation. The simulator 400 comprises memory 420 (e.g. volatile and/or non-volatile memory, etc.) for storing instructions of the computer program(s) executed by the processing unit 410, data generated by the execution of the computer program(s), data received via a communication interface 430, etc.

The simulator 400 comprises the communication interface 430, for exchanging data with other entities, in particular with the computing device 200 through the network 300. The simulator 400 comprises at least one display 440 (e.g. a regular screen or a tactile screen) for displaying data processed and/or generated by the processing unit 410. The simulator 400 comprises at least one user interface 450 allowing a user to interact with the simulator 400 for performing the simulation. The user interface(s) 450 may include traditional computer user interfaces (e.g. keyboard, mouse, trackpad, touch screen, etc.), as well as dedicated simulation user interfaces (e.g. switches, simulation command controls, joysticks, etc.).

The simulator 400 may further comprise one or more dedicated hardware components 460, such as sensors, mechanical actuators, pneumatic actuators, hydraulic actuators, displays, switches, lights, electric components, etc. The processing unit 410 may receive data from a particular dedicated hardware component 460 and/or send commands to another dedicated hardware component 460 (e.g. receive data from a sensor and send actuating commands to an actuator). The dedicated hardware components 460 make the simulation more realistic, and closer to real world operating conditions of the simulated entity. For example, in the case of an aircraft simulator, the simulator 400 usually consists of a realistic model of a cockpit of the aircraft, comprising a plurality of dedicated hardware components 460.

Figure 4:
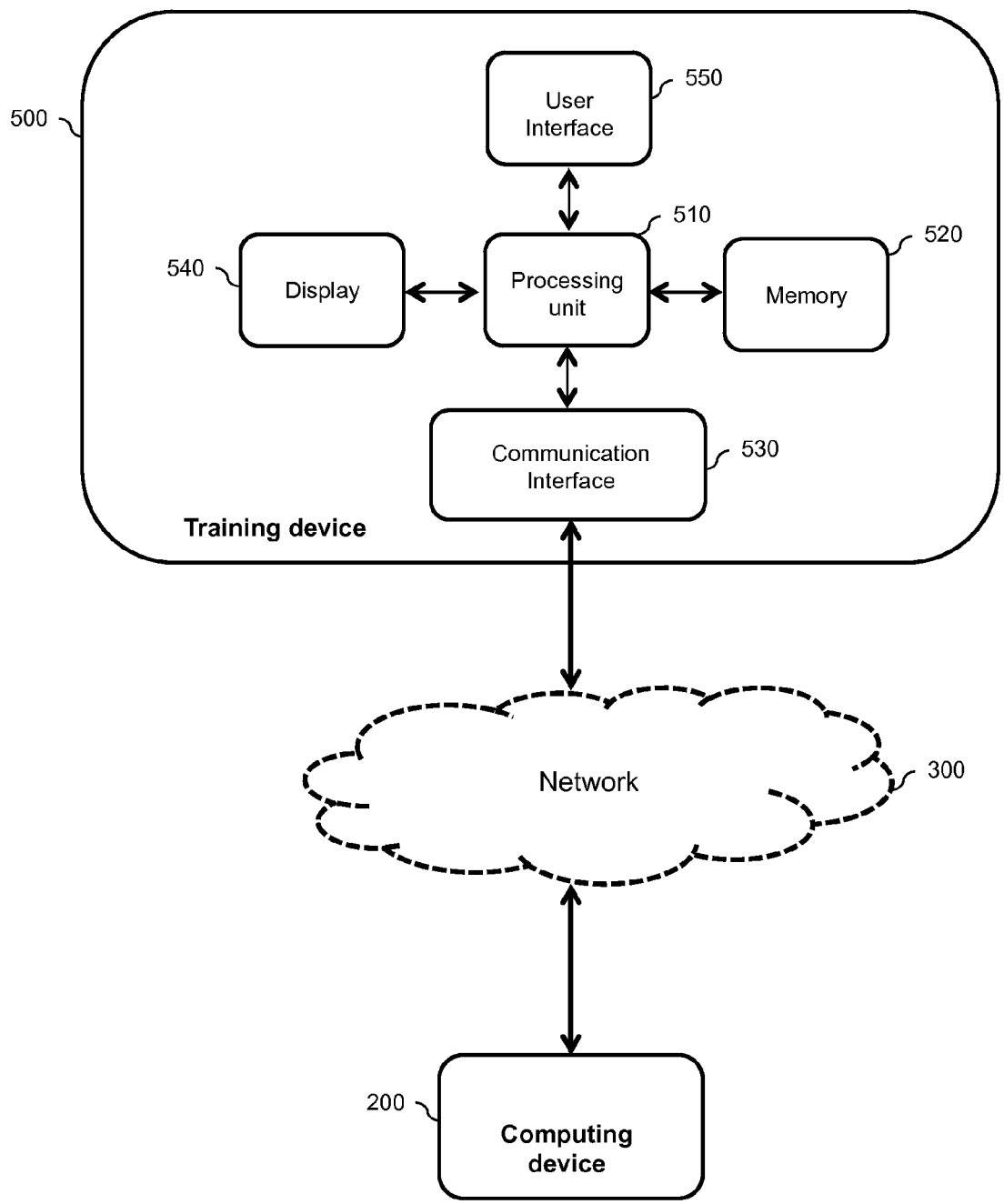
FIG. 4 illustrates details of a training device represented in FIG. 2.

Referring now to FIG. 4, details of the training device 500 are represented. The training device 500 receives an interactive training scenario generated and transmitted by the computing device 200. The interactive training scenario is executed by the training device 500 for training users of the training device 500. Compared to the real time simulation executed by the simulator 400, the interactive training scenario executed by the training device 500 provides a more restrained environment. For instance, interactions of trainees with the training device 500 are more limited, directed, and focused on a specific purpose of the training scenario. Thus, the training device 500 provides a learning environment for teaching skills to the trainees, while the simulator 400 provides a testing environment for validating skills learned by the trainees.

The training device 500 comprises a processing unit 510, having one or more processors capable of executing instructions of computer program(s) for executing the interactive training scenario. The training device 500 comprises memory 520 (e.g. volatile and/or non-volatile memory, etc.) for storing instructions of the computer program(s) executed by the processing unit 510, data generated by the execution of the computer program(s), data received via a communication interface 530, etc.

The training device 500 comprises the communication interface 530, for exchanging data with other entities, in particular with the computing device 200 through the network 300. The training device 500 comprises at least one display 540 (e.g. a regular screen or a tactile screen) for displaying data processed and/or generated by the processing unit 510. The simulator 500 comprises at least one user interface 550 allowing a user to interact with the training device 500 for performing the interactive training scenario. The user interface(s) 550 includes traditional computer user interfaces, such as a keyboard, a mouse, a trackpad, a touch screen, etc.

The training device 500 can be implemented by a dedicated computer or server, or alternatively by a standard desktop computer, laptop or a tablet, depending for instance on the computing power required from the processing unit 510 and the capacity required from the memory 520 for executing the interactive training scenario. In another alternative, a laptop or a tablet provides the display 540 and the user interface(s) 550 of the training device 500, and communicates with a dedicated computer or server of a cloud computing environment. The dedicated computer or server provides the processing unit 510, memory 520 and communication interface 530 of the training device 500.

Reference is now made concurrently to FIGS. 1, 2, and 3. FIG. 1 represents steps of the method 100 performed by the simulator 400, the computing device 200 and the training device 500 of FIG. 2 for generating and executing an interactive training scenario based on a recorded real time simulation.

The method 100 comprises the step 105 of executing a real time simulation on the real time simulator 400.

Executing the real time simulation on the real time simulator 400 comprises at least one of the following: controlling the execution of the real time simulation via the processing unit 410 of the simulator 400, receiving interactions from a user performing the real time simulation via the user interface(s) 450 of the simulator, and displaying information generated by the execution of the real time simulation on the display(s) 440 of the simulator 400. The interactions received from the user are processed by the processing unit 410, for example to generate actions influencing the execution of the real time simulation.

Furthermore, the processing unit 410 may receive and process data from one or more dedicated hardware components 460 such as sensors, and process the received data. Alternatively or complementarily, the processing unit 410 generates commands sent to one or more dedicated hardware components 460 such as actuators.

The method 100 comprises the step 110 of recording data corresponding to the real time simulation at the real time simulator 400. The recording is performed by the processing unit 410, and the recorded data are stored in the memory 420 of the simulator 400. Although represented as two independent steps in FIG. 1 for illustration purposes only, steps 105 and 110 of the method 100 are closely related: when the execution of the real time simulation as per step 105 generates data of interest, these data are recorded as per step 110.

The recorded data are organized according to a simulation timeline, in order to determine and memorize a time reference relative to each particular information among the recorded data. The timeline may be expressed in minutes, in seconds, in milliseconds, or with an even better granularity, based on the specific type of real time simulation executed on the simulator 400. Alternatively, the simulation timeline may be simply indicative of an order of occurrence for one or more particular recorded data with respect to other recorded data, without specifically recording a time of occurrence for each of the particular recorded data.

The recorded data comprise at least one of the following: an action performed by a user interacting with the real time simulation, an event occurring during the real time simulation, a variation of a parameter during the real time simulation, etc.

For instance, a user performing the real time simulation interacts with the simulator 400 via the user interface(s) 550. The processing unit 410 generates a specific action (corresponding to the interaction) affecting the execution of the simulation, and records the specific action. The processing unit 410 generates a specific event during the execution of the simulation, and records the specific event. The processing unit 410 generates a variation of a specific parameter during the execution of the simulation, and records the variation of the specific parameter (e.g. different values of the specific parameter at different times during the simulation). The processing unit 410 generates specific information during the execution of the simulation, and displays the specific information on the display(s) 440.

As mentioned previously, these various types of recorded data are organized according to the simulation timeline. For example, an event E is recorded at time $t_1$ (e.g. 5.000 seconds), and an action A corresponding to a user interaction in response to the event E is recorded at time $t_2$ (e.g. 6.000 seconds). The action A triggers a variation of a parameter P, and the value of the parameter P is recorded at times $t_3$ (e.g. 6.100 seconds), $t_4$ (e.g. 6.200 seconds), and $t_5$ (e.g. 6.300 seconds).

The recorded data are used by the computing device 200 to generate an interactive training scenario, as will be described later in the description. Consequently, the real time simulation is generally performed (on the simulator 400) by an experienced user (e.g. an instructor) in the appropriate field (e.g. flying a particular type of combat aircraft), in order to record data corresponding to a perfectly executed simulation sequence. For example, the simulation sequence is a realistic simulation of a phase of a flight of an aircraft, such as takeoff or landing. The interactive training scenario generated by the computing device 200 corresponds to the simulation sequence, and is used to teach trainees how to perform the simulation sequence. Once the trainees have been appropriately trained with the interactive training scenario on the training device 500, they can practice the corresponding simulation sequence on the simulator 400. The instructor may repeat the simulation sequence on the simulator 400 as many times as required, until he is satisfied that the recorded data will allow the generation of the corresponding interactive training scenario with a satisfying level of accuracy and pedagogy. Furthermore, the instructor may execute a plurality of simulation sequences corresponding to various phases of the operation of the simulated object (e.g. takeoff, landing, low altitude flight, high altitude flight, etc. for an aircraft), in order to generate a library of corresponding interactive training scenarios for training trainees to adequately perform the various phases.

The method 100 comprises the step 115 of transmitting the recorded data from the real time simulator 400 to the computing device 200. The recorded data are transmitted by the processing unit 410 of the simulator 400 via its communication interface 430, over the network 300.

Figure 5:
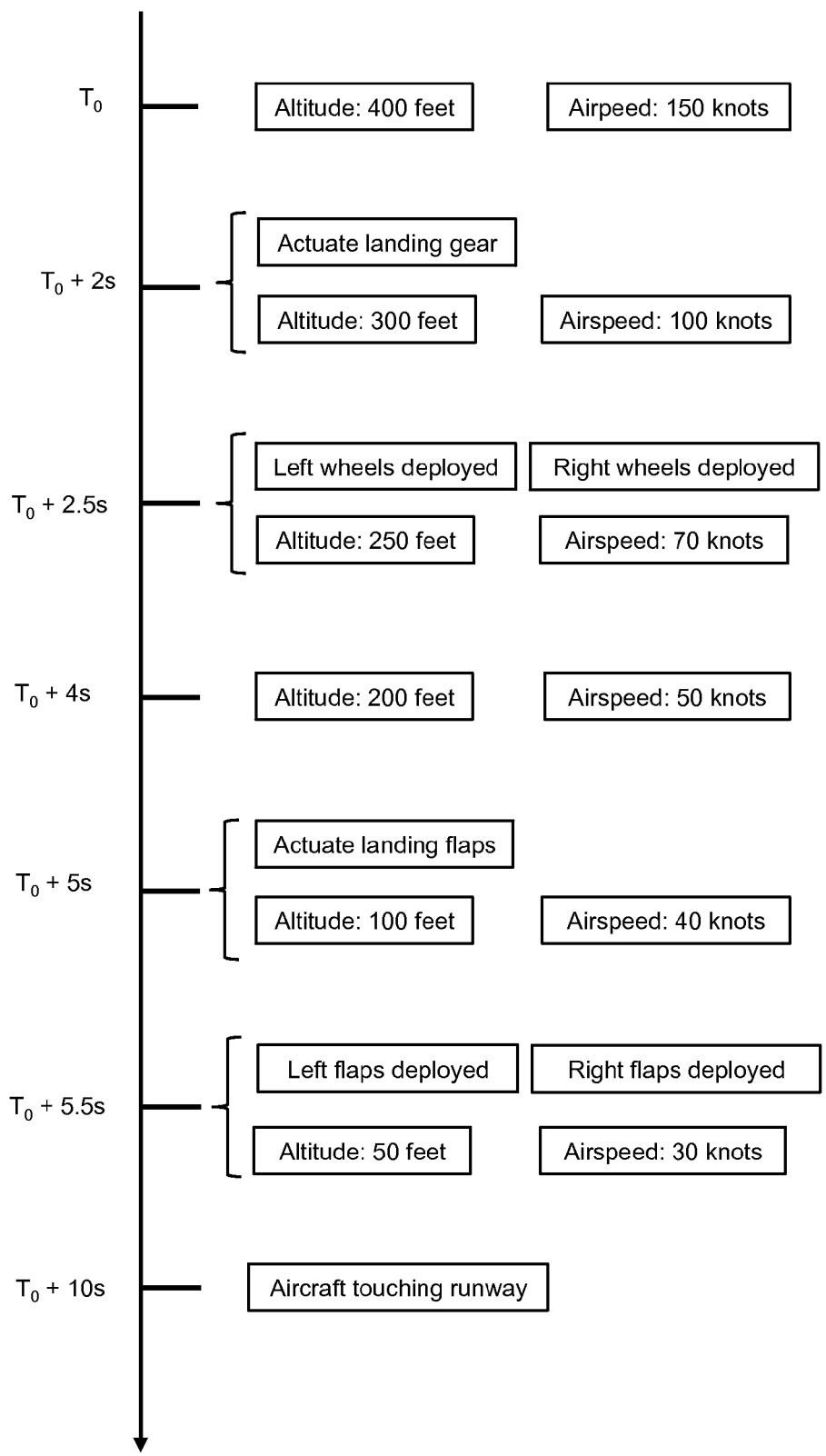
FIG. 5 illustrates exemplary recorded data of a real time simulation organized according to a simulation timeline.

Referring now concurrently to FIGS. 3 and 5, exemplary recorded data of a real time simulation organized according to a simulation timeline are represented (in FIG. 5).

The recorded data are representative of a landing phase of an aircraft simulated in real time on a flight simulator 400. The recorded data are recorded by the processing unit 410 during the execution of the landing phase by the simulator 400. The recorded data of FIG. 5 are for illustration purposes, and are not meant to be perfectly accurate from an aeronautical point of view. The simulation timeline is represented as a vertical axis.

At reference time $T_0$ of the simulation, values of two flight parameters, altitude and airspeed, are recorded with respective values of 400 feet and 150 knots. These values are calculated by the processing unit 410 while performing the simulation. The display 440 represents a control panel of the aircraft, comprising an altimeter for displaying the simulated altitude (400 feet) and an airspeed indicator for displaying the simulated airspeed (150 knots).

At reference time $T_0+2$ seconds, an instructor interacts with the simulator 400 via the user interface 450, and a corresponding action of actuating the landing gear of the aircraft is generated by the processing unit 410 and recorded. Values of the altitude and airspeed are also calculated and recorded by the processing unit 410, with respective values of 300 feet and 100 knots.

At reference time $T_0+2.5$ seconds, the processing unit 410 generates two events in response to the action performed at $T_0+2$ seconds: left wheels deployed and right wheels deployed, which are recorded. Values of the altitude and airspeed are also calculated and recorded by the processing unit 410, with respective values of 250 feet and 75 knots. The display 440 displays the simulated altitude (250 feet), the simulated airspeed (75 knots), and a visual indicator for the events left wheels deployed and right wheels deployed.

At reference time $T_0+4$ seconds, values of the altitude and airspeed are calculated and recorded by the processing unit 410, with respective values of 200 feet and 50 knots.

At reference time $T_0+5$ seconds, the instructor interacts with the simulator 400 via the user interface 450, and a corresponding action of actuating the landing flaps of the aircraft is generated by the processing unit 410 and recorded. Values of the altitude and airspeed are also calculated and recorded by the processing unit 410, with respective values of 100 feet and 40 knots.

At reference time $T_0+5.5$ seconds, the processing unit 410 generates two events in response to the action performed at $T_0+5$ seconds: left flaps deployed and right flaps deployed, which are recorded. Values of the altitude and airspeed are also calculated and recorded by the processing unit 410, with respective values of 50 feet and 30 knots. The display 440 displays the simulated altitude (50 feet), the simulated airspeed (30 knots), and a visual indicator for the events left flaps deployed and right flaps deployed.

At reference time $T_0+10$ seconds, the processing unit 410 generates the event aircraft touching runway, which is recorded.

The recorded data organized according to the simulation timeline are further processed, to generate an interactive training scenario, as will be detailed in the following paragraphs. The interactive training scenario can be used to teach trainees the appropriate landing sequence for the simulated aircraft, in particular the appropriate moment (in terms of altitude and airspeed) for actuating the landing gear and the landing flaps.

Referring now concurrently to FIGS. 1 and 2, the steps of the method 100 performed by the computing device 200 are illustrated.

The method 100 comprises the step 120 of receiving the recorded data corresponding to the real time simulation at the computing device 200. The recorded data are received by the processing unit 210 of the computing device 200 via its communication interface 230.

The method 100 comprises the step 125 of processing the recorded data by the processing unit 210 of the computing device 200, to generate the interactive training scenario. The interactive training scenario comprises training data organized according to a training timeline. The training timeline is generated based on the simulation timeline.

In a particular aspect, generating the interactive training scenario comprises re-organizing at least some of the recorded data organized according to the simulation timeline into the training data organized according to the training timeline. The re-organization of the data can be performed by a user of the computing device 200 via the user interface 250. The simulation timeline, the recorded data, the training timeline and the training data are displayed on the display 240, via a dedicated Graphical User Interface (GUI) facilitating the re-organization. Such a GUI is well known in the art, and generally consists in a set of graphical tools (comprising icons, menus, etc.) for performing the re-organization of the data.

The simulation timeline comprises a plurality of simulation time references and the training timeline comprises a plurality of training time references. The generation of the training timeline based on the simulation timeline comprises determining the plurality of training time references based on the plurality of simulation time references. The number of training time references may be equal to, higher to or lower than the number of simulation time references. For instance, if the recorded data associated to a particular simulation time reference comprise several items, the several items may be associated to different training time references. Additionally, two or more items associated to different simulation time references may be associated to the same training time reference.

In another particular aspect, generating the interactive training scenario comprises adding complementary data to the recorded data re-organized according to the training timeline. For instance, for a particular training time reference having items generated based on the recorded data, additional item(s) based on the complementary data may be added to this particular training time reference. Additionally, a training time reference only comprising item(s) based on the complementary data may be created. The complementary data are received via a configuration interface of the computing device 200. The configuration interface comprises the user interface 250, allowing a user of the computing device 200 to generate the complementary data and integrate them to the training timeline. The configuration interface may also comprise the communication interface 230, for receiving at least some of the complementary data from a third party computing device through the network 300.

In yet another particular aspect, a plurality of interactive training scenarios are generated based on the recorded data corresponding to the real time simulation. Each specific interactive training scenario comprises training data organized according to a specific training timeline. For example, the recorded data correspond to the real time simulation of the landing phase of an aircraft. A first interactive training scenario is generated based on the recorded data corresponding to the landing phase before the aircraft has touched the runway. A second interactive training scenario is generated based on the recorded data corresponding to the landing phase after the aircraft has touched the runway. In another example, a first interactive training scenario is generated based on recorded data, allowing a limited amount of interactions with the training scenario (for less advanced trainees). A second interactive training scenario is generated based on the same recorded data, allowing a larger amount of interactions with the training scenario (for more advanced trainees).

The method 100 comprises the step 130 of transmitting the interactive training scenario from the computing device 200 to the training device 500. The interactive training scenario is transmitted by the processing unit 210 of the computing device 200 via its communication interface 230, over the network 300.

The interactive training scenario can also be stored in a permanent memory 220 (e.g. a hard drive) of the computing device 200, and transmitted upon request to a plurality of training devices 500. Thus, a plurality of trainees can practice in parallel the same interactive training scenario (or different interactive scenarios stored in the memory 220) on the plurality of training devices 500.

Figure 6A:
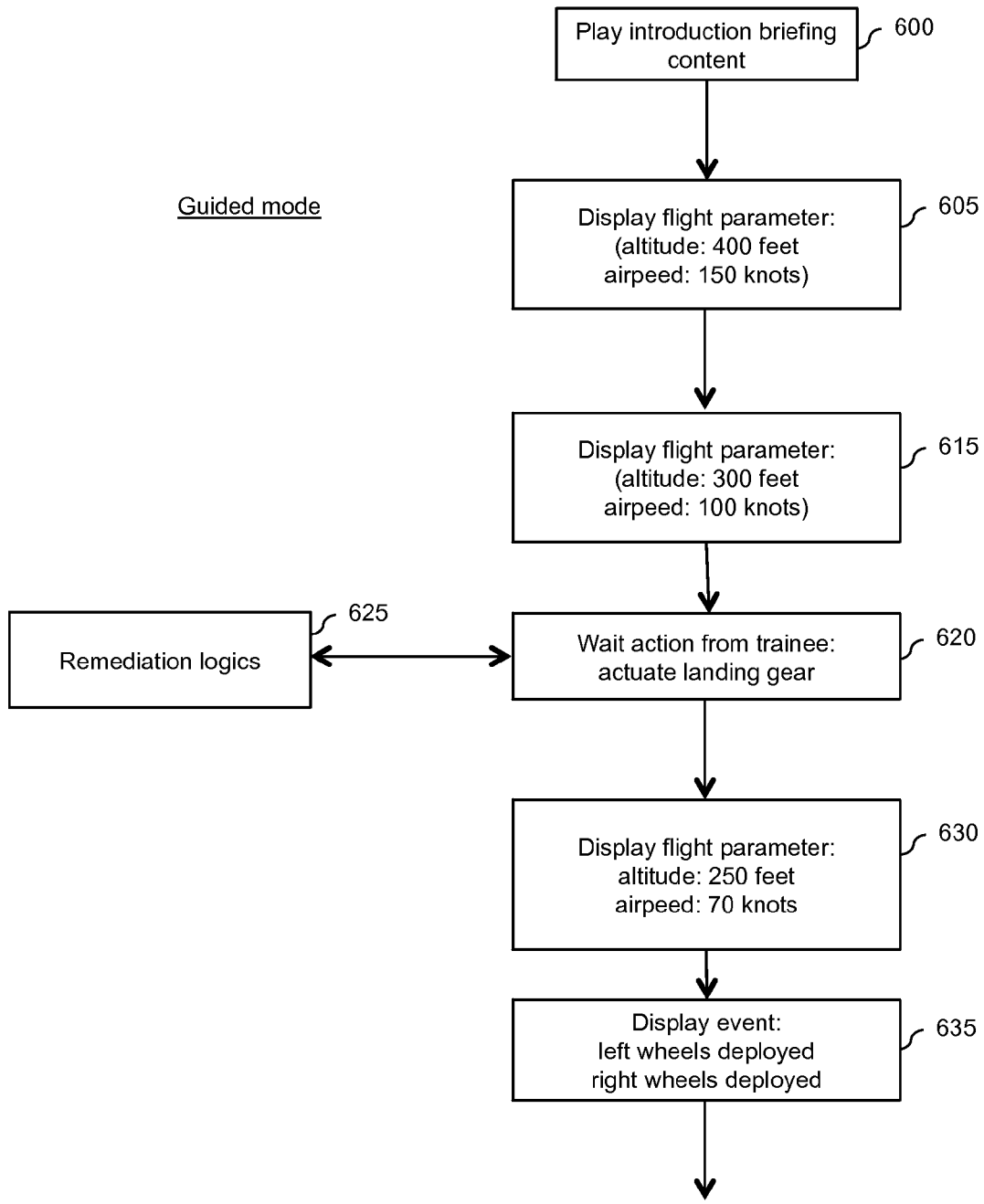
FIGS. 6A and 6B illustrate exemplary training data of an interactive training scenario organized according to a training timeline in a guided mode.
Figure 6B:
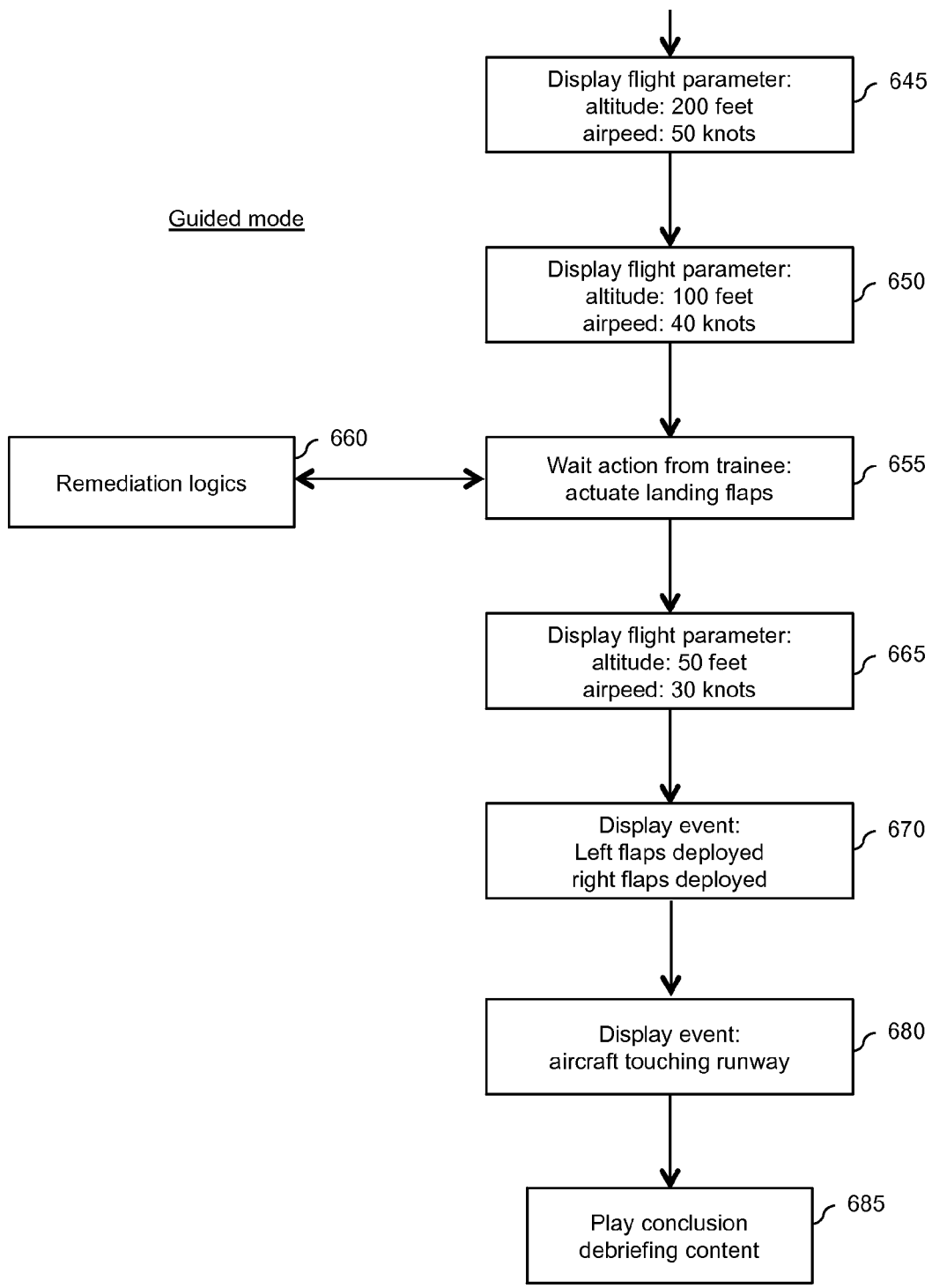

Referring now concurrently to FIGS. 2, 3, 6A and 6B, exemplary training data of an interactive training scenario organized according to a training timeline are represented (in FIGS. 6A and 6B). The interactive training scenario is generated by the processing unit 210 of the computing device 200 based on the recorded simulation data represented in FIG. 5. The training timeline represented in FIGS. 6A and 6B consists in a training state machine based on the simulation timeline represented in FIG. 5.

The training state machine comprises an initial step 600 consisting in playing an introduction briefing content, such as a video, a slide, an image, a text, etc. Step 600 has no equivalent in the simulation timeline of FIG. 5. Step 600 is added by the processing unit 210 through interactions of a user via the user interface 250 of the computing device 200. The introduction briefing content may be stored in the memory 220, or received via the communication interface 230 from a third party computing device through the network 300.

The training state machine comprises step 605 consisting in displaying flight parameters: an altitude of 400 feet and an airspeed of 150 knots. Step 605 is generated by the processing unit 210 through interactions of the user via the user interface 250, based on the recorded simulation data (recorded flight parameters) of FIG. 5.

The training state machine comprises step 615 consisting in displaying flight parameters: an altitude of 300 feet and an airspeed of 100 knots. Step 605 is generated in a similar manner as step 605.

The training state machine comprises step 620 consisting in waiting for an action from a trainee practicing the interactive training scenario: actuate landing gear. Step 620 is generated by the processing unit 210 through interactions of the user via the user interface 250, based on the recorded simulation data of FIG. 5. The action of actuating the landing gear in the recorded simulation data of FIG. 5 is processed by the processing unit 210, to generate step 620 consisting in waiting for an interaction with the trainee to actuate the landing gear.

The training state machine comprises step 625 consisting in applying a remediation logics. The remediation logics analyzes the action effectively taken by the trainee and compares it to the expected action. If the action performed by the trainee is the one expected, the remediation logics directly jumps to next step 630. Otherwise, the remediation logics takes a specific action to address the error performed by the trainee, such as displaying an error message, displaying highlighted graphics, executing an auto-playback (e.g. jump back to step 605), etc. Step 625 has no equivalent in the simulation timeline of FIG. 5. Step 625 is added by the processing unit 210 through interactions of the user via the user interface 250. Alternatively, step 625 can be automatically added by the processing unit 210 as a pre-defined complementary step to a step requiring an action from the trainee (e.g. step 620).

Steps 620 and 625 correspond to a particular mode of the training state machine: a guided mode, where the trainee performs interactions (e.g. at step 620), and the remediation logics reacts in real time to the interactions with the trainee (e.g. at step 625). The training state machine may operate in different modes. The user of the computing device 200 selects a particular mode among a list of pre-defined modes, and the generation of the training state machine takes into account the selected mode (e.g. via a rule manager) to generate specific steps (e.g. 620 and 625) of the training state machine.

Figure 7A:
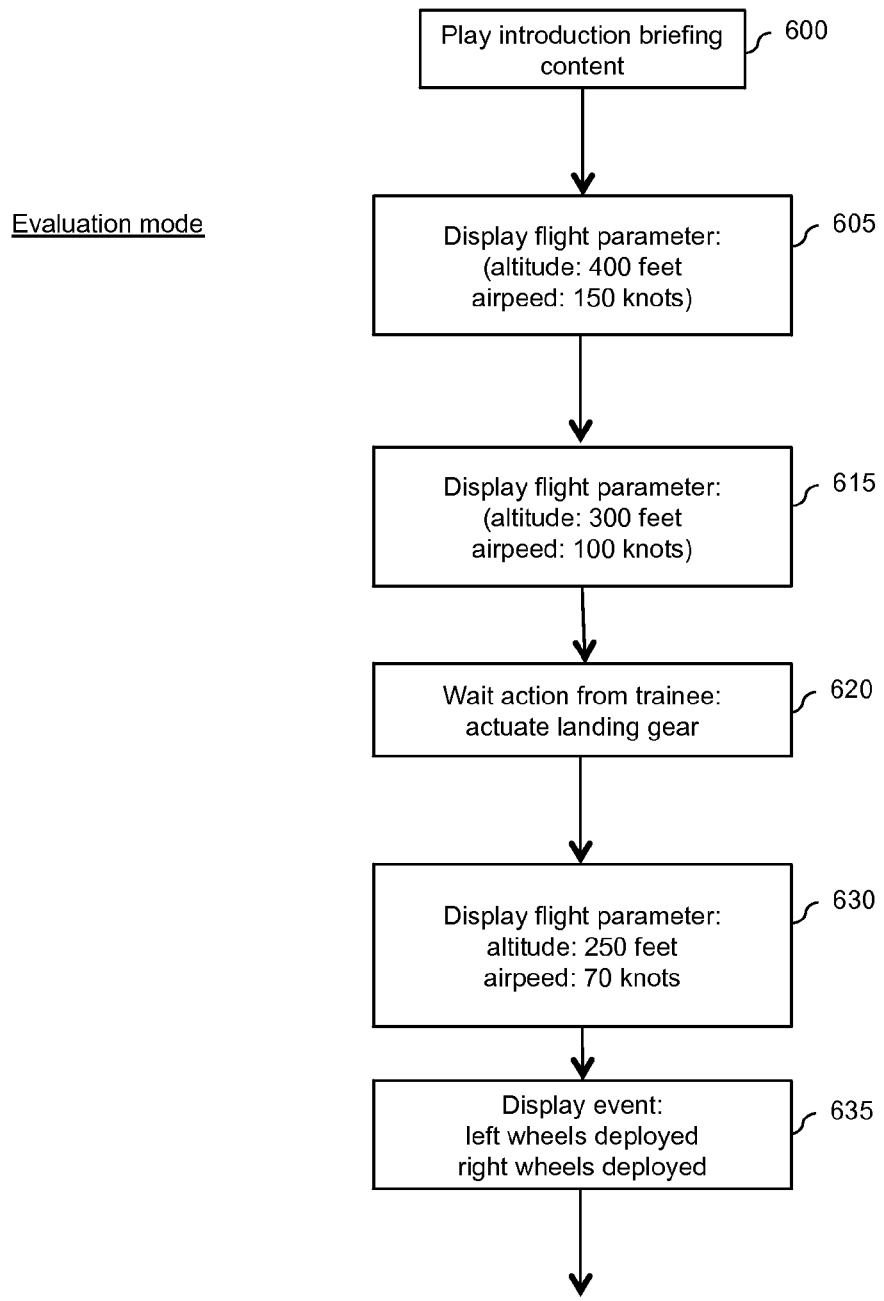
FIGS. 7A and 7B illustrate exemplary training data of an interactive training scenario organized according to a training timeline in an evaluation mode.
Figure 7B:
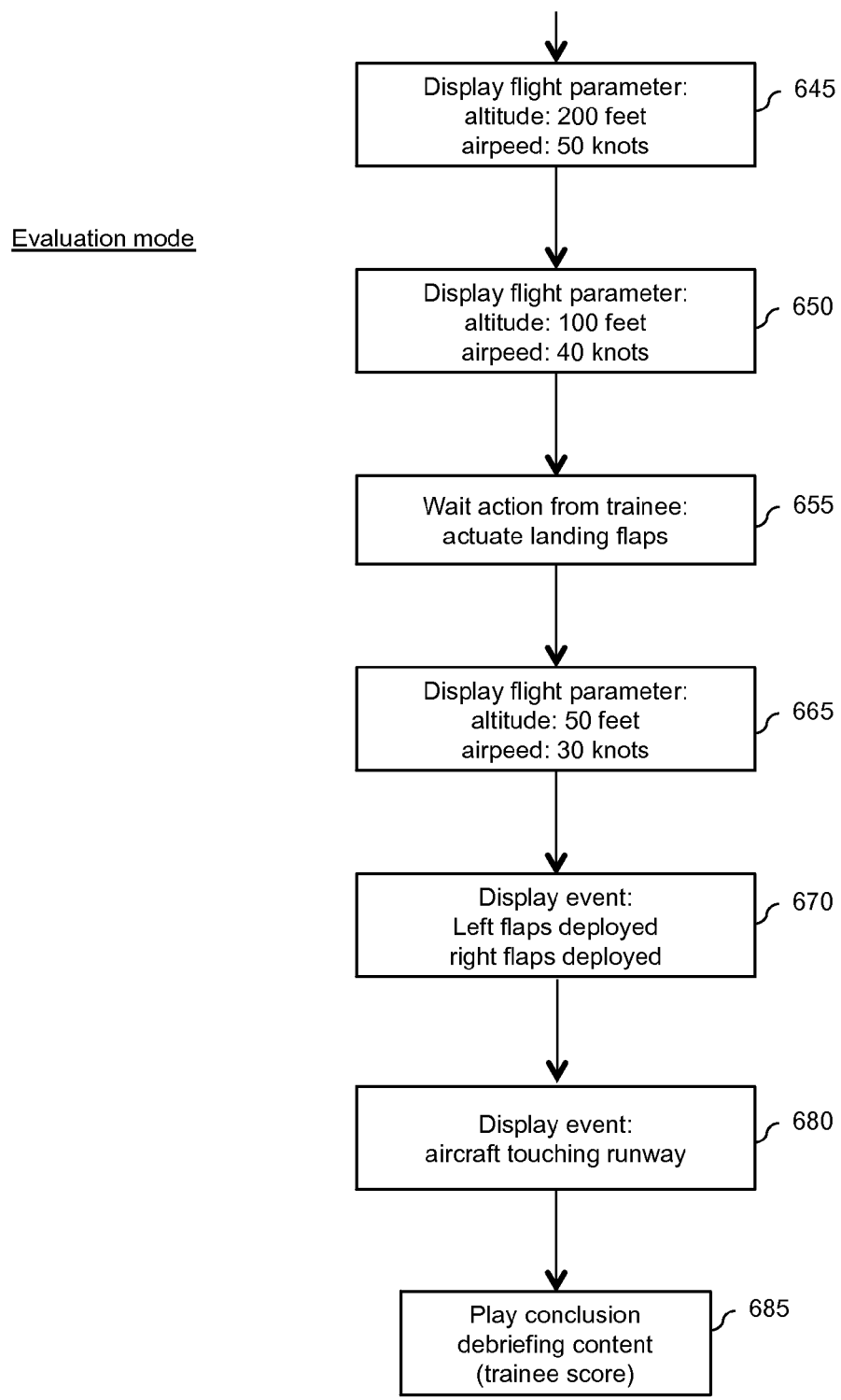

FIGS. 7A and 7B illustrate another particular mode of the training state machine: an evaluation mode, where the trainee performs interactions (e.g. at step 620), but no remediation logics is involved. At the end of the training session, the performance of the trainee is evaluated (e.g. determine the number of errors performed by the trainee, for instance at step 620). A score is given to the trainee at the end of the training session (e.g. at step 685, which will be detailed later in the description).

Figure 8A:
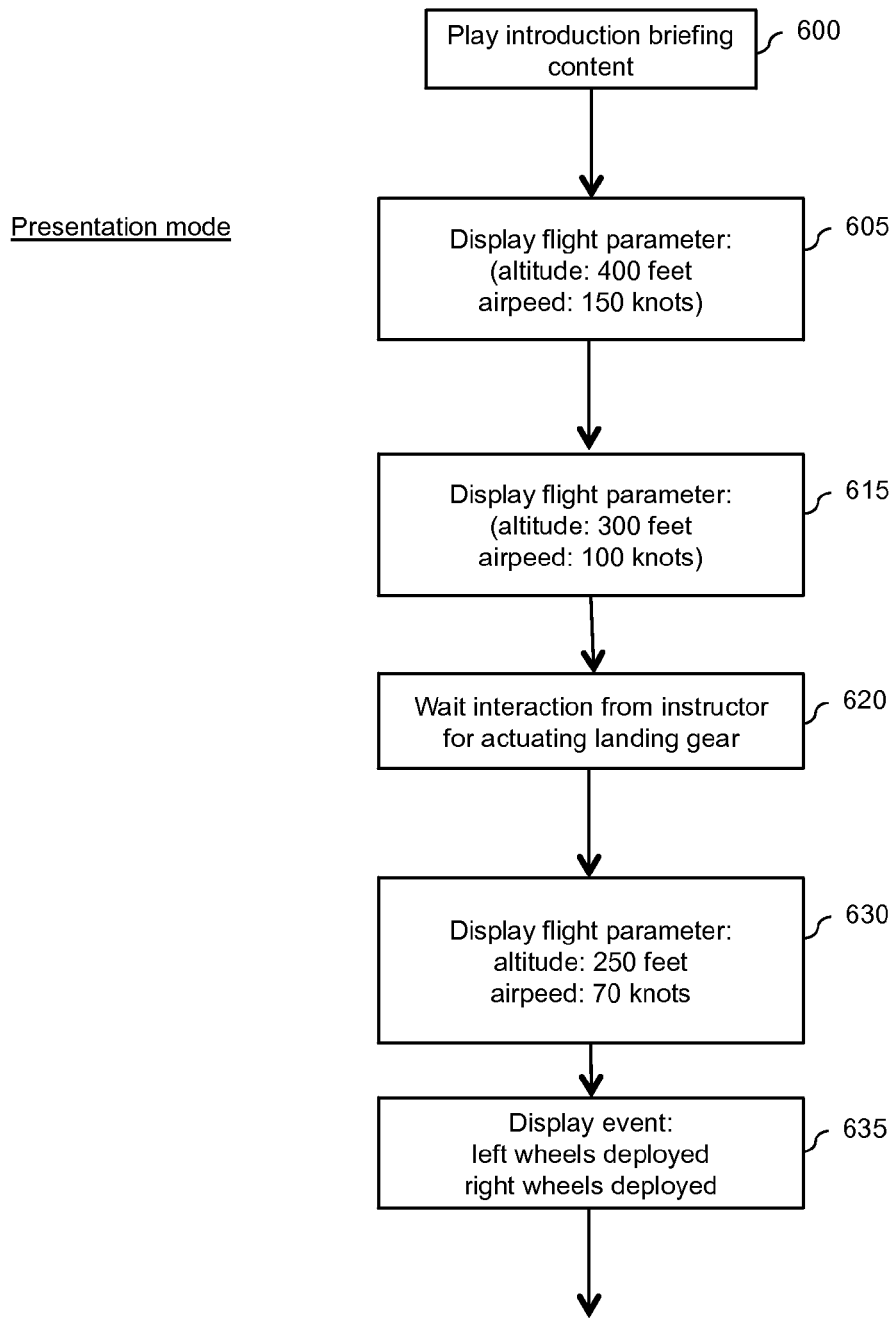
FIGS. 8A and 8B illustrate exemplary training data of an interactive training scenario organized according to a training timeline in a presentation mode.
Figure 8B:
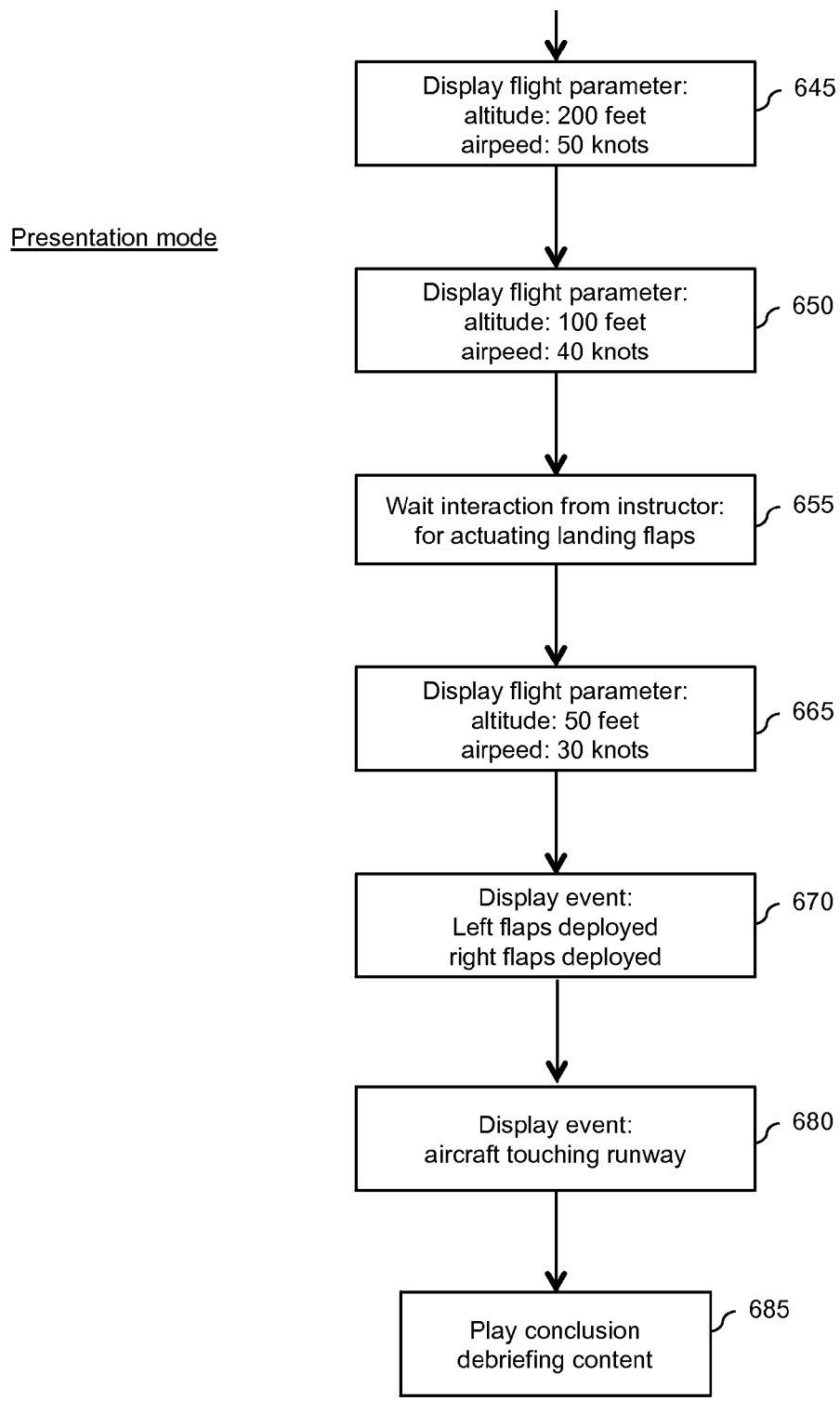

FIGS. 8A and 8B illustrate another particular mode of the training state machine: a presentation mode, where the instructor performs interactions (e.g. at step 620). In this mode, the training state machine stops at each determined action (e.g. step 620), but the interaction does not consist in performing the determined action, but rather indicate (e.g. by pressing a next or play button) to proceed with the determined action (e.g. display an indication that the determined action is performed and proceed to next step).

Figure 9A:
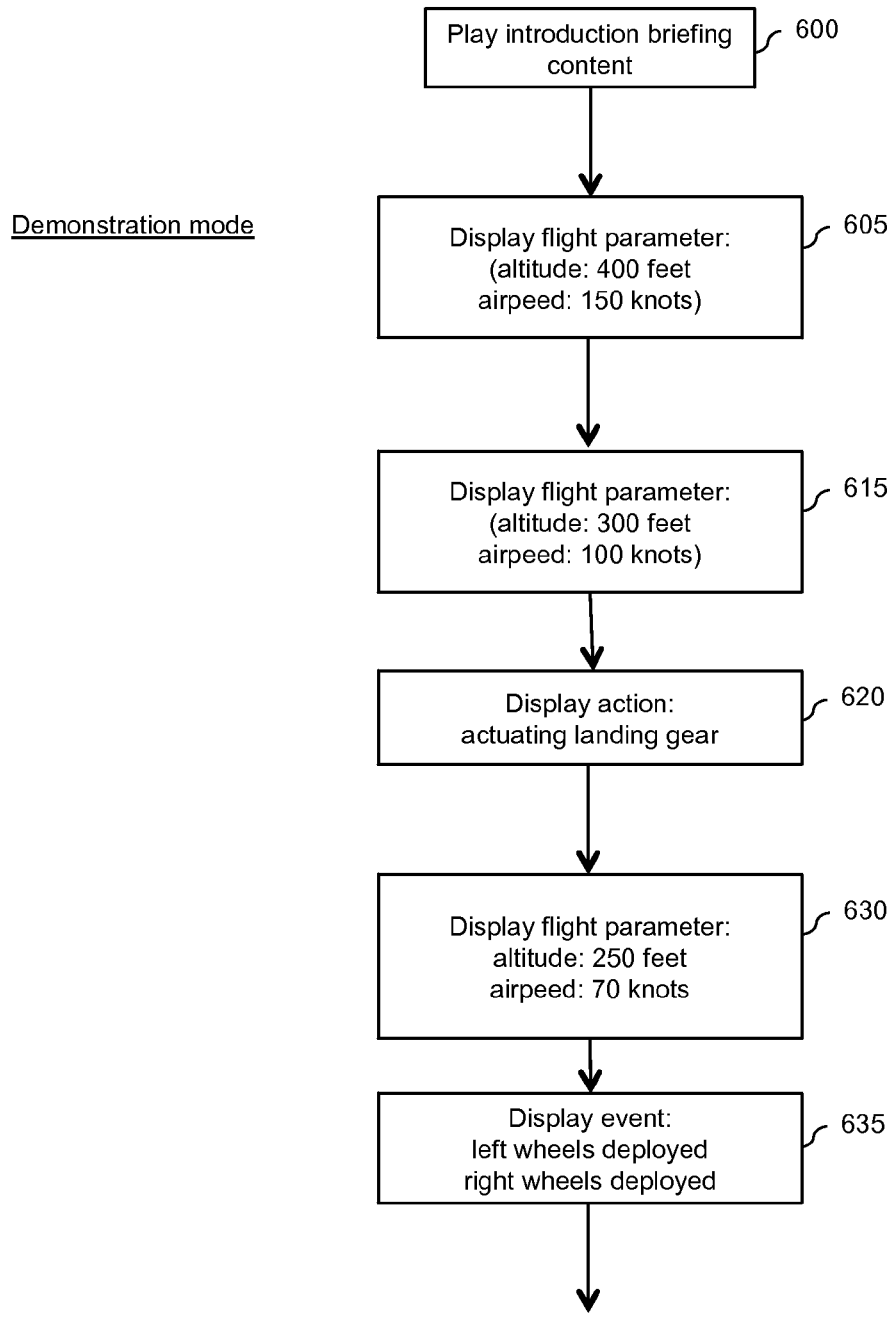
FIGS. 9A and 9B illustrate exemplary training data of an interactive training scenario organized according to a training timeline in a demonstration mode.
Figure 9B:
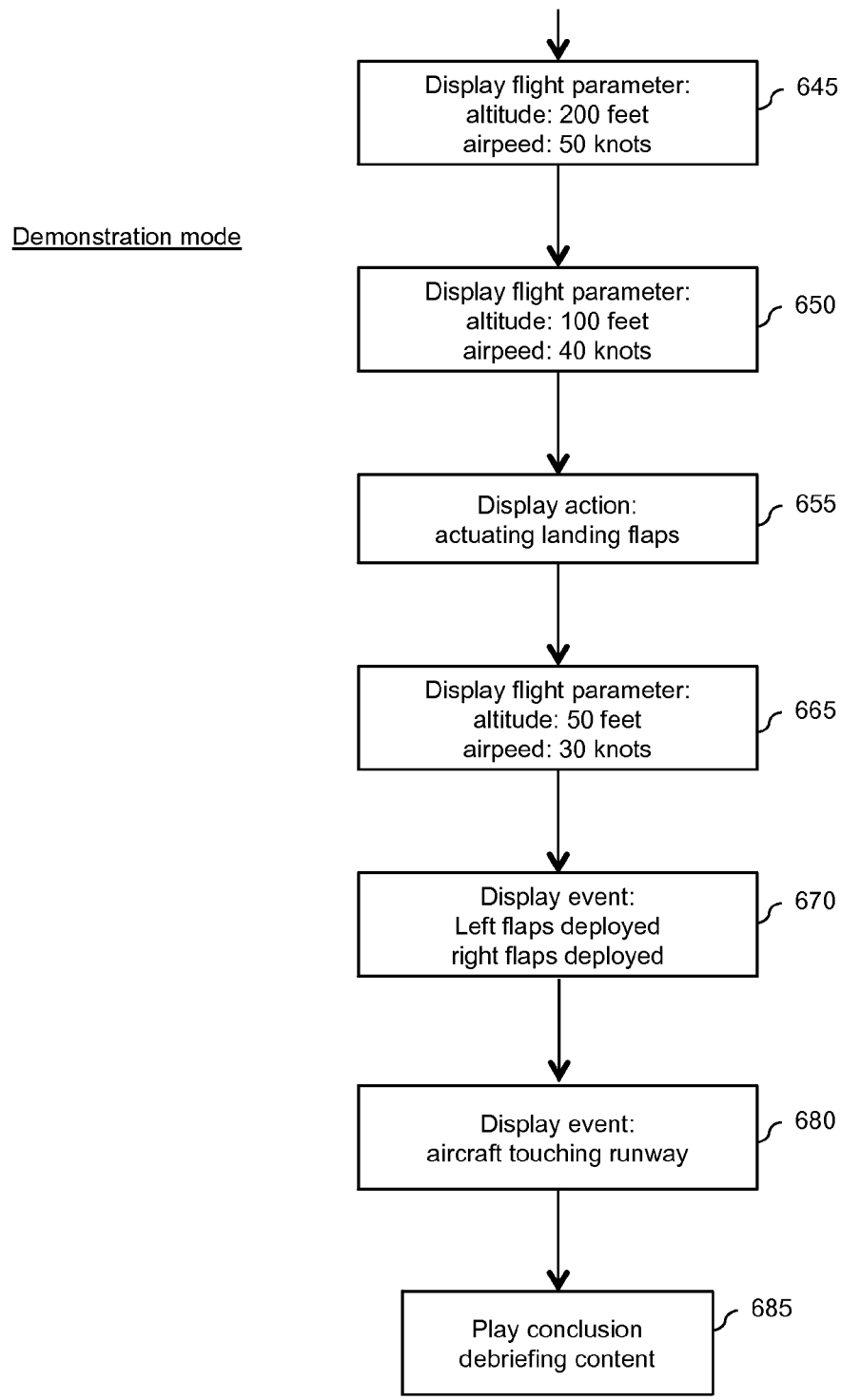

FIGS. 9A and 9B illustrate another particular mode of the training state machine: a demonstration mode, where no interactions is needed (executing the training state machine is similar to playing a training video).

Although four particular modes have been described for illustration purposes, the training state machine may operate in other modes. Furthermore, a combination of different modes of operation may be combined in a single training state machine.

Referring back to FIGS. 2, 3, 6A and 6B, the training state machine comprises step 630 consisting in displaying flight parameters: an altitude of 250 feet and an airspeed of 70 knots. Step 630 is generated in a similar manner as step 605.

The training state machine comprises step 635 consisting in displaying an event: left wheels deployed and right wheels deployed. Step 635 is generated by the processing unit 210 through interactions of the user via the user interface 250, based on the recorded simulation data (recorded event) of FIG. 5.

The training state machine comprises step 645 consisting in displaying flight parameters: an altitude of 200 feet and an airspeed of 50 knots. Step 645 is generated in a similar manner as step 605.

The training state machine comprises step 650 consisting in displaying flight parameters: an altitude of 100 feet and an airspeed of 40 knots. Step 650 is generated in a similar manner as step 605.

The training state machine comprises step 655 consisting in waiting for an action from the trainee practicing the interactive training scenario: actuate landing flaps. Step 655 is generated in a similar manner as step 620.

The training state machine comprises step 660 consisting in applying a remediation logics. Step 660 is generated in a similar manner as step 625.

Steps 655 and 660 correspond to the guided mode of the training state machine. In the evaluation mode, a similar step 655 is generated and no step 660 is generated, as illustrated in FIG. 7B. In the presentation mode, a different step 655 is generated and no step 660 is generated, as illustrated in FIG. 8B. In the demonstration mode, another different step 655 is generated and no step 660 is generated, as illustrated in FIG. 9B.

The training state machine comprises step 665 consisting in displaying flight parameters: an altitude of 50 feet and an airspeed of 30 knots. Step 665 is generated in a similar manner as step 605.

The training state machine comprises step 670 consisting in displaying an event: left flaps deployed and right flaps deployed. Step 670 is generated in a similar manner as step 635.

The training state machine comprises step 680 consisting in displaying an event: aircraft touching runway. Step 680 is generated in a similar manner as step 635.

The training state machine comprises a final step 685 consisting in playing a conclusion debriefing content, such as a video, a slide, an image, a text, etc. Step 685 is generated in a similar manner as step 600. Although not represented in FIGS. 6A and 6B, the training state machine may give the possibility to the trainee to go back to one or several pre-defined steps (e.g. initial step 600) after executing the final step 685.

As mentioned previously, in the evaluation mode, the final step 685 includes displaying a score given to the trainee, as illustrated in FIG. 7B.

Referring now concurrently to FIGS. 1, 2 and 4, the steps of the method 100 performed by the training device 500 are illustrated.

The method 100 comprises the step 135 of receiving the interactive training scenario at the training device 500. The interactive training scenario is received by the processing unit 510 of the training device 500 via its communication interface 530.

The method 100 comprises the step 140 of executing the interactive training scenario on the training device 500 according to the training timeline of the scenario.

Executing the interactive training scenario on the training device 500 according to the training timeline comprises at least one of the following: controlling the execution of the interactive training scenario according to the training timeline via the processing unit 510 of the training device 500, receiving interactions from a user performing the interactive training scenario via the user interface(s) 550 of the training device 500, and displaying information generated by the execution of the interactive training scenario on the display(s) 540 of the training device 500.

The interactions received from the user are processed by the processing unit 510, and may impact the execution of the interactive training scenario. As mentioned previously, the type of interaction and its impact depends on a particular mode of execution of the interactive training scenario. In the guided mode, the interaction is performed by the trainee for selecting an action to be executed, and the action is evaluated by remediation logics. In the evaluation mode, the interaction is performed by the trainee for selecting an action to be executed, but the action is not evaluated by remediation logics (a trainee score is calculated at the end of the execution of the interactive training scenario). In the presentation mode, the interaction is performed by the instructor for controlling the pace of the interactive training scenario (when a pre-defined action is executed). In the demonstration mode, no interaction is needed for executing the interactive training scenario.

Reference is now made concurrently to FIGS. 4, 6A and 6B to illustrate the execution of an exemplary interactive training scenario on the training device 500. In this example, the interactive training scenario is executed according to the guided mode.

Controlling the execution of the interactive training scenario according to the training timeline via the processing unit 510 comprises controlling the execution of the steps of the training state machine of FIGS. 6A and 6B. The processing unit 510 executes the initial step 600, then step 605, then step 615, then step 620. The processing unit 510 executes step 625 for analyzing the action performed at step 620. The other steps of the training state machine are executed according to the same principle. The transition between two steps (e.g. step 600 and step 605) can be triggered by a trainee interaction via the user interface(s) 550. For example, the trainee clicks on an acknowledge button of a GUI displayed on the display(s) 540, to indicate that he has finished the current step and is ready to proceed to the next step. Alternatively, the transition between two steps (e.g. steps 605 and 615, 615 and 620) can be triggered automatically by the processing unit 510, after a pre-determined amount of time (which has been determined based on the corresponding simulation timeline represented in FIG. 5). For these steps, the interactive training scenario is executed in a similar manner has it would be on the simulator 400 of FIG. 3, making these steps more realistic and close to real life conditions.

Receiving interactions from a user performing the interactive training scenario (from the trainee in the guided mode) via the user interface(s) 550 comprises receiving the previously mentioned acknowledgement from the trainee, to proceed from a current step to a next step (e.g. step 600 to step 605). It occurs when the trainee has assimilated all the information displayed on the display(s) 540 during the current step. Receiving interactions also comprises receiving a specific type of interaction from the trainee, when a particular action related to the training scenario is expected, as illustrated by steps 620 and 655. For example, specific graphical triggers (e.g. buttons, icons, etc.) corresponding respectively to actuating the landing gear for step 620 and actuating the landing flaps for step 655 are displayed on the display(s) 540. The trainee is expected to select the proper graphical trigger when the proper step is executed (e.g. select the graphical trigger corresponding to actuating the landing gear when step 620 is executed by the processing unit 510).

Displaying information generated by the execution of the interactive training scenario on the display(s) 540 comprises displaying tutorial content (e.g. introduction briefing content at step 600 and conclusion briefing content at step 685), displaying values of flight parameters (e.g. steps 605, 615, 630, 645, 650 and 665), displaying events occurring after an interaction with the trainee (e.g. step 635 corresponding to the trainee interaction at step 620 and step 670 corresponding to the trainee interaction at step 655), displaying events occurring during the execution of the interactive training scenario (e.g. step 680). In the particular case of the guided mode, the remediation logics may display (at steps 625 and 660) error messages, highlighted graphics, etc., when the trainee does not interact as expected with the interactive training scenario.

The execution of an exemplary interactive training scenario on the training device 500 according to the evaluation mode, the presentation mode and the demonstration mode is similar to the guided mode, but is adapted to each specific mode (as illustrated respectively in FIGS. 7A-B, 8A-B and 9A-B). For instance, user interactions at steps 620 and 655 also consist in trainee interactions in the evaluation mode, but consist in instructor interactions in the presentation mode. No user interaction is needed at steps 620 and 655 in the demonstration mode.

As mentioned previously, the training device 500 may consist of a standard computer, server, laptop, tablet, etc., with a processing unit 510 executing instructions of a dedicated software for executing the interactive training scenario according to the training timeline. Alternatively, the training device 500 consists of a real time simulator (e.g. the simulator 400 of FIG. 3) operating in a restricted mode, for solely executing the interactive training scenario according to the training timeline.

Customization of the Recorded Data

Figure 10:
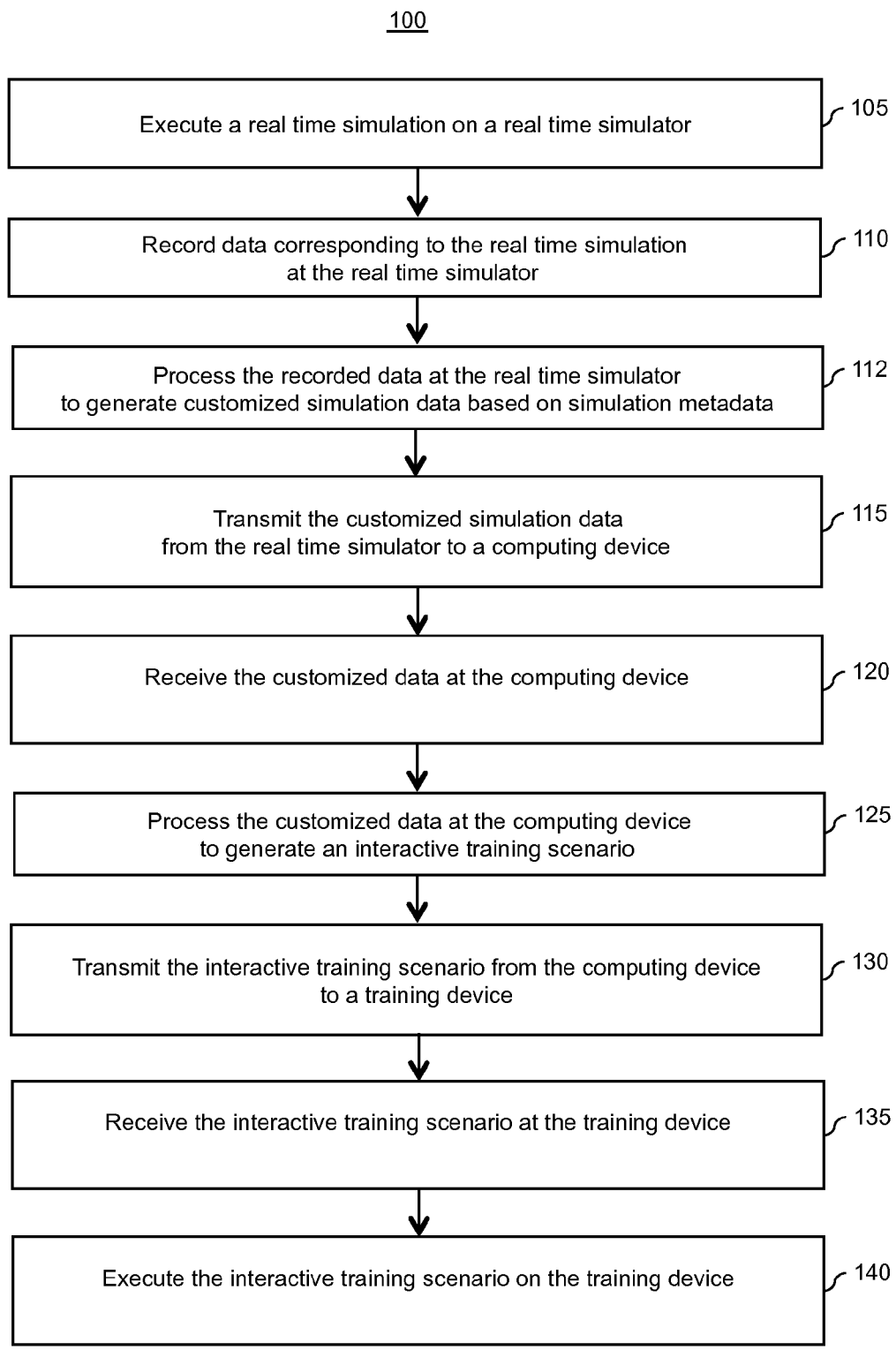
FIGS. 10 and 11 illustrate the method of FIG. 1 being adapted for customizing recorded data based on simulation metadata.

Referring now concurrently to FIGS. 2, 3 and 10, an alternative to the method 100 represented in FIG. 1 is represented. The alternative comprises the additional step 112 of processing the recorded data of step 110 to generate customized simulation data based on simulation metadata. The customized simulation data are used to generate the interactive training scenario at step 125, in place of directly using the recorded data as illustrated in FIG. 1.

In the embodiment illustrated in FIG. 10, step 112 is implemented by the processing unit 410 of the simulator 400 and the simulation metadata are stored in the memory 420 of the simulator 400. Steps 115, 120 and 125 are similar to the steps represented in FIG. 1. However, the customized simulation data (instead of the recorded data as illustrated in FIG. 1) are transmitted from the simulator 400 to the computing device 200 at step 115. Thus, the customized simulation data (instead of the recorded data as illustrated in FIG. 1) are received by the computing device 200 at step 120. Furthermore, the customized simulation data (instead of the recorded data as illustrated in FIG. 1) are processed by the processing unit 210 of the computing device 200 to generate the interactive training scenario at step 125.

Figure 11:
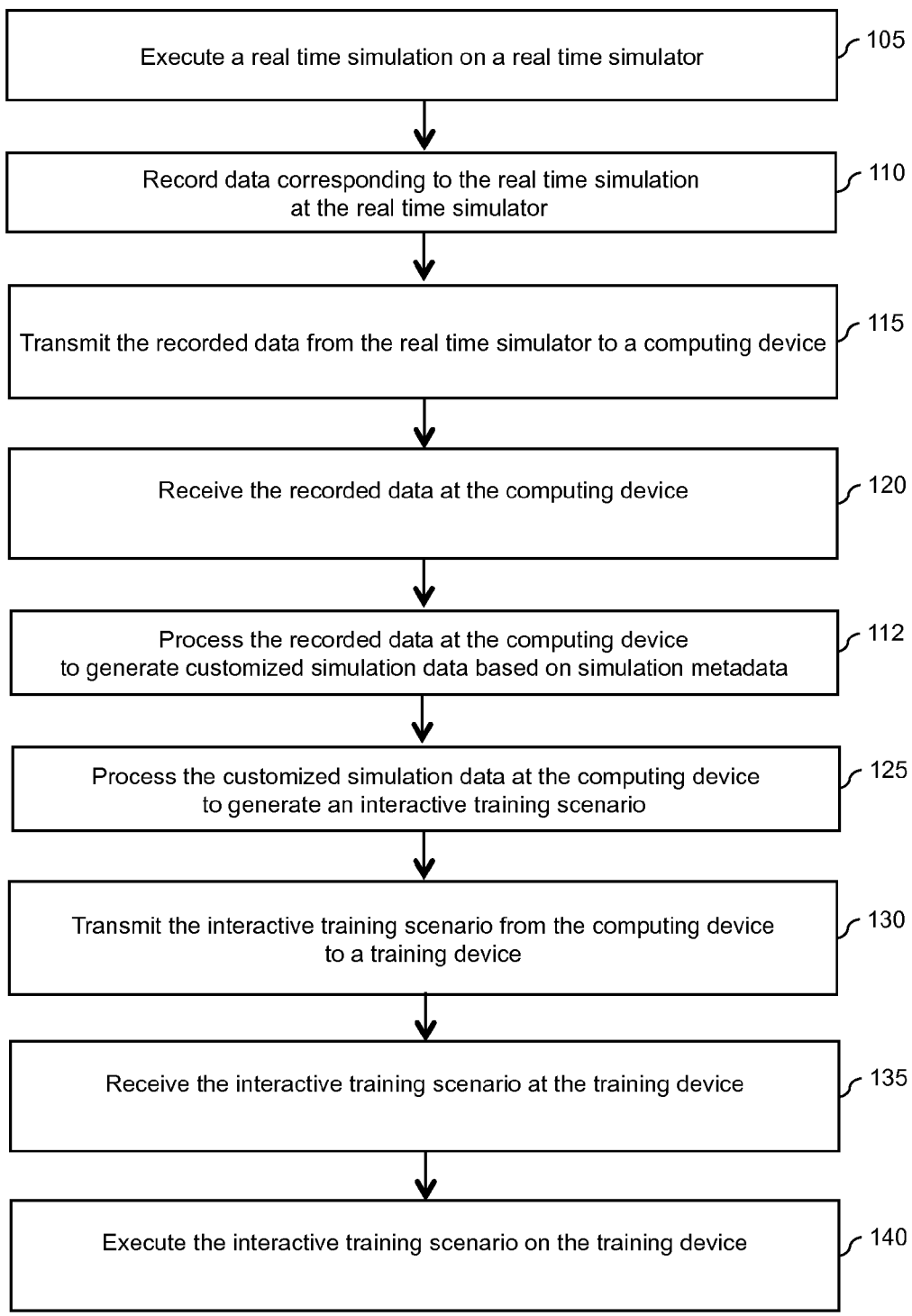

In an alternative embodiment illustrated in FIG. 11, step 112 is implemented by the processing unit 210 of the computing device 200 and the simulation metadata are stored in the memory 220 of the computing device 200. In this embodiment, steps 115 and 120 are identical to the steps represented in FIG. 1. The recorded data are transmitted from the simulator 400 to the computing device 200. Step 125 is similar to the step represented in FIG. 1, except that the customized simulation data (instead of the recorded data as illustrated in FIG. 1) are processed by the processing unit 210 of the computing device 200 to generate the interactive training scenario.

In still an alternative embodiment not illustrated in the Figures, step 112 may be implemented by a processing unit of a third party device not represented in the Figures. In this case, the recorded data generated at step 110 are transmitted by the simulator 400 to the third party device. The third party device performs step 112 to generate the customized simulation data using the received recorded data and simulation metadata stored at the third party device. The customized simulation data are transmitted by the third party device to the computing device 200, which performs step 125 on the received customized simulation data to generate the interactive training scenario.

The customized simulation data are organized according to an updated simulation timeline, which is generated based on the original simulation timeline of the recorded data. The updated simulation timeline of the customized simulation data is used to generate the interactive training scenario at step 125 of FIGS. 10 and 11, in a similar manner as the original simulation timeline of the recorded data was used at step 125 of FIG. 1.

Depending on the generated customized simulation data, the updated simulation timeline may comprise the same number, less or more time references than the original simulation timeline of the recorded data. For example, FIG. 5 illustrates recorded data with an original timeline comprising seven time references (from $T_0$ to $T_0+10$ s). The updated simulation timeline of the customized simulation data generated by processing the recorded data may include the same seven time references, less time references (e.g. time reference $T_0+4$ seconds is removed with the corresponding simulation data), or more time references (e.g. a new time reference $T_0+6$ seconds is added with corresponding simulation data).

The role of the customization is to offer more flexibility with respect to the simulation data used at step 125 for generating the interactive training scenario. For example, it may not be possible to control the recording of at least some of the data recorded at step 110 by the simulator 400. For instance, the simulator 400 is statically configured to record a large number of data, and the interactive training scenario generated based on this large number of recorded data would be too complex. Furthermore, it would be too long and too complicated for a user of the computing device 200 to filter unnecessary recorded data, to generate a simplified interactive training scenario. In this context, the simulation metadata are used to automatically simplify the recorded data and generate customized simulation data with a reasonable level of complexity, which can be easily manipulated by a user of the computing device 200 to generate the interactive training scenario.

In another example, the metadata can be used to facilitate the generation of several interactive training scenarios based on the same set of recorded data. For this purpose, the simulation metadata comprise a plurality of templates. Based on the selection of a particular template, the recorded data are automatically processed to generate a particular set of customized simulation data dedicated to the generation of a corresponding particular interactive training scenario. For example, a first template is dedicated to trainees having a low level of training. The generation of the customized simulation data based on the first template consists in simplifying the recorded data, so that the generated customized simulation data are adapted to easily generate an interactive training scenario with a level of complexity (low) corresponding to a low level of training. A second template is dedicated to trainees having a medium level of training.

The generation of the customized simulation data based on the second template also consists in simplifying the recorded data (but to a lower extent than for the first template), so that the generated customized simulation data are adapted to easily generate an interactive training scenario with a level of complexity (medium) corresponding to a medium level of training. A third template is dedicated to trainees having an advanced level of training. The generation of the customized simulation data based on the third template simply consists in keeping all the recorded data, so that the generated customized simulation data are adapted to easily generate an interactive training scenario with a level of complexity (high) corresponding to an advanced level of training. The particular template can be selected among a plurality of templates by a user operating the device performing step 112 (the simulator 400 in FIG. 10 and the computing device 200 in FIG. 11). As mentioned previously, the templates can be used to generate customized simulation data corresponding to various modes of interactive training scenarios (e.g. guided mode, evaluation mode, presentation mode, demonstration mode, etc.).

In a particular aspect, generating at step 112 the customized simulation data based on the simulation metadata comprises generating a new datum corresponding to a plurality of recorded data according to the simulation metadata. For example, the simulation metadata specifies that when simulation data of types TYPE_1, TYPE_2 and TYPE_3 are present in the recorded data, then a new simulation datum of type NEW_TYPE shall be generated. In a first alternative, the generated customized simulation data comprise the new simulation datum of type NEW_TYPE in replacement of the simulation data of types TYPE_1, TYPE_2 and TYPE_3. This provides a means of automatically simplifying the recorded data based on the simulation metadata, as previously mentioned. In a second alternative, the generated customized simulation data comprise the new simulation datum of type NEW_TYPE and the original simulation data of types TYPE_1, TYPE_2 and TYPE_3. The capability of choosing between generating a more complex interactive training scenario (with simulation data of types TYPE_1, TYPE_2 and TYPE_3) or a less complex interactive training scenario (with simulation datum of type NEW_TYPE in place of simulation data of types TYPE_1, TYPE_2 and TYPE_3) is offered to a user of the computing device 200 when performing step 125. Furthermore, instead of a single datum, a plurality of data corresponding to the aforementioned plurality of recorded data may be generated according to the simulation metadata.

In another particular aspect, generating at step 112 the customized simulation data based on the simulation metadata comprises one of the following: removing at least one recorded datum according to the simulation metadata or renaming at least one recorded datum according to the simulation metadata.

In the case where the recorded data comprise a plurality of actions performed by a user interacting with the real time simulation, generating the customized simulation data based on the simulation metadata may comprise generating a new action corresponding to the plurality of actions according to the simulation metadata. The plurality of actions consists in two or more actions. The generated customized simulation data may comprise the new action in replacement of the plurality of actions. Alternatively, the generated customized simulation data comprise the new action and the plurality of actions.

Figure 12A:
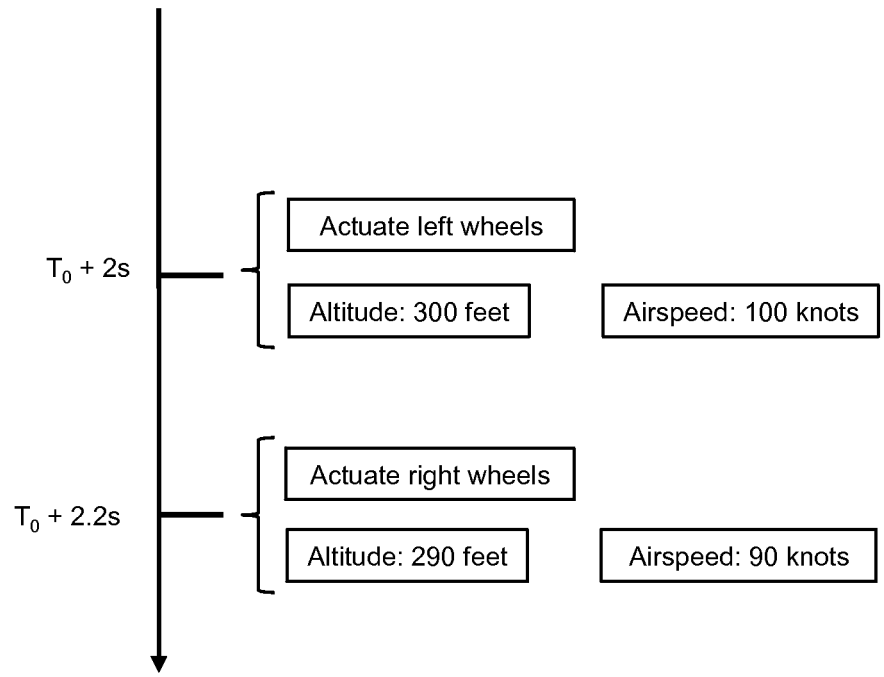
FIGS. 12A-B, 13A-B, 14A-B and 15A-B illustrate recorded data and corresponding customized simulation data generated based on simulation metadata.
Figure 12B:
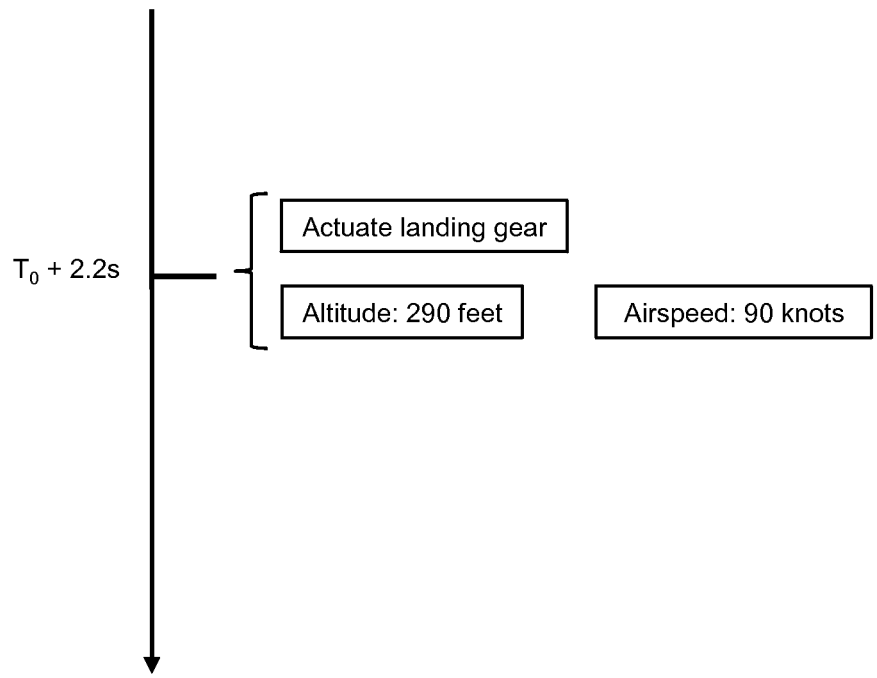

For example, FIG. 12A represents recorded data comprising two actions: actuate left wheels at $T_0+2$ seconds and actuate right wheels at $T_0+2.2$ seconds. The simulation metadata specify that the original actions "actuate left wheels" and "actuate right wheels" shall be replaced by a single new action: actuate landing gear. Furthermore, the simulation metadata specify that the new action shall replace the original action occurring the last (actuate right wheels in FIG. 12A). Thus, the original action occurring first is removed. Additionally, the simulation metadata may have a generic rule specifying that in case an original action is removed, any variation of a parameter associated to the removed action shall also be removed (measurements of altitude and airspeed occurring at $T_0+2$ seconds in FIG. 12A). FIG. 12B illustrates the result of applying the simulation metadata to process the recorded data of FIG. 12A. The customized simulation data of FIG. 12B comprise a single generic action "actuate landing gear" in place of the more detailed actions "actuate left wheels" and "actuate right wheels". In this case, the updated simulation timeline of FIG. 12B comprises the time reference $T_0+2.2$ seconds of the original simulation timeline of FIG. 12A, but the time reference $T_0+2$ seconds of the original simulation timeline of FIG. 12A has been removed.

In the case where the recorded data comprise a plurality of events occurring during the real time simulation, generating the customized simulation data based on the simulation metadata may comprise generating a new event corresponding to the plurality of events according to the simulation metadata. The plurality of events consists in two or more events. The generated customized simulation data may comprise the new event in replacement of the plurality of events. Alternatively, the generated customized simulation data comprise the new event and the plurality of events.

Figure 13A:
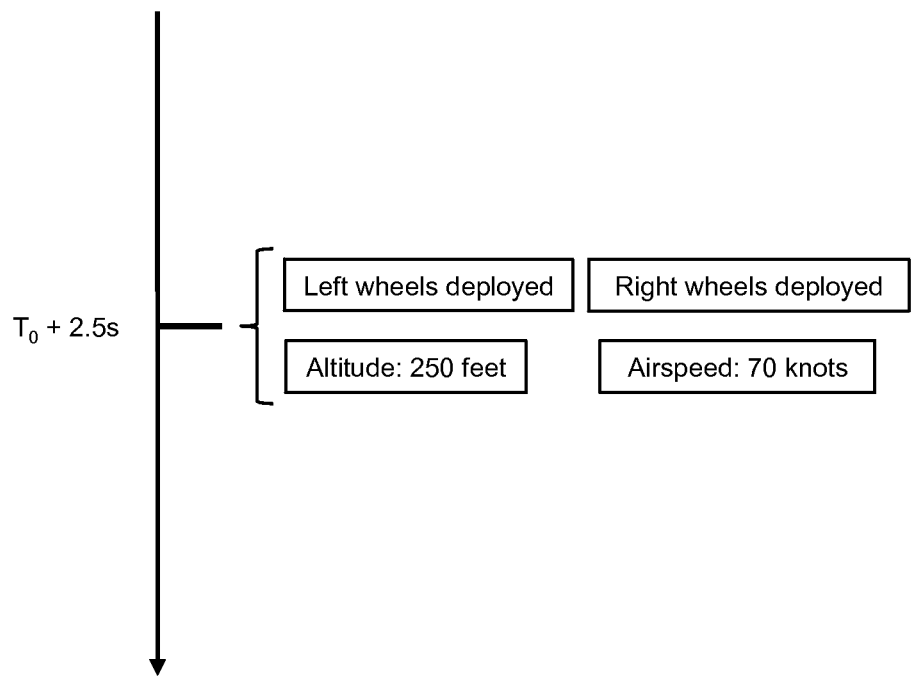
Figure 13B:
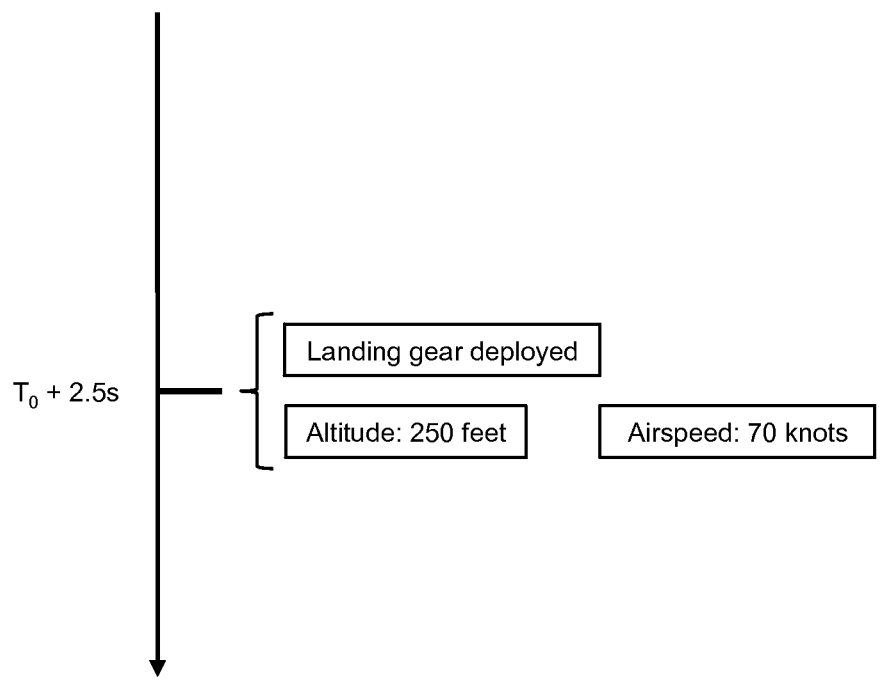

For example, FIG. 13A represents recorded data comprising two events: left wheels deployed at $T_0+2.5$ seconds and right wheels deployed also at $T_0+2.5$ seconds also. The simulation metadata specify that the original events "left wheels deployed" and "right wheels deployed" shall be replaced by a single new event: landing gear deployed. Furthermore, the simulation metadata specify that the new event shall replace the original event occurring the last (they are occurring simultaneously in FIG. 13A). Thus, the original events are both replaced by the new event. Additionally, the simulation metadata may have a generic rule specifying that in case an original event is removed, any variation of a parameter associated to the removed event shall also be removed (not applicable for FIG. 13A). FIG. 13B illustrates the result of applying the simulation metadata to process the recorded data of FIG. 13A. The customized simulation data of FIG. 13B comprise a single generic event "landing gear deployed" in place of the more detailed events "left wheels deployed" and "right wheels deployed". In this case, the updated simulation timeline of FIG. 13B comprises the time reference $T_0+2.5$ seconds of the original simulation timeline of FIG. 13A.

In the case where the recorded data comprise a variation of a parameter during the real time simulation, generating the customized simulation data based on the simulation metadata may comprise removing the variation of the parameter according to the simulation metadata. The recorded variation of the parameter includes a plurality of values for the parameter at different reference times, and the simulation metadata specifies which subset of the plurality of values shall be removed (e.g. all the values, or only specific values for which a condition is met).

Figure 14A:
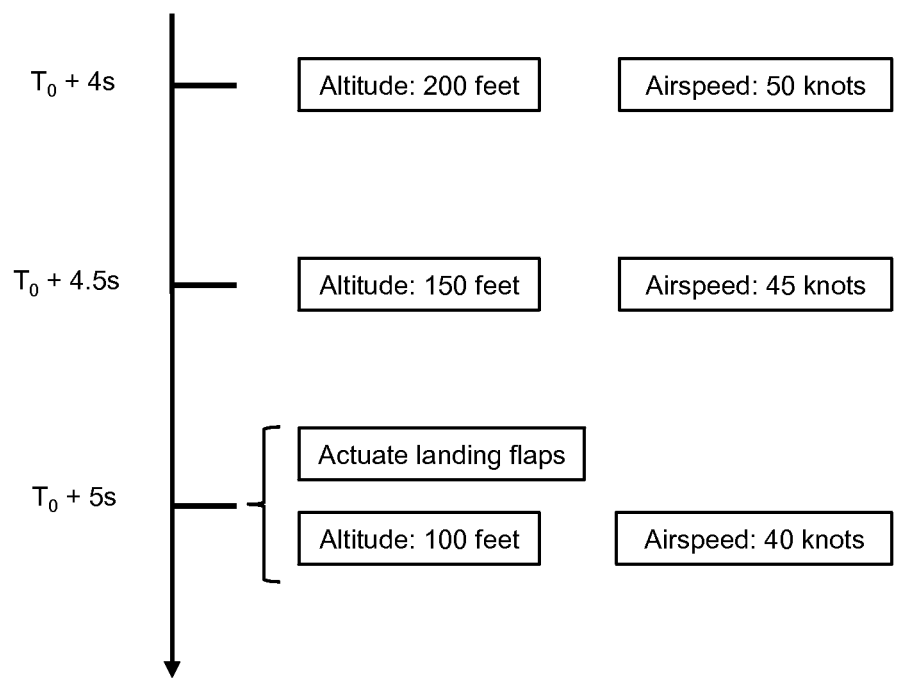
Figure 14B:
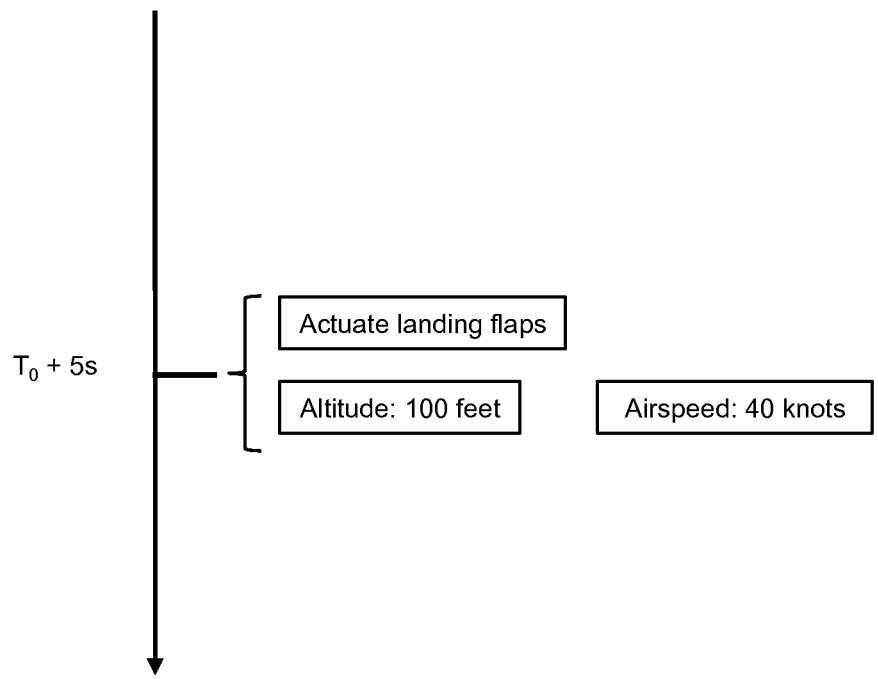

For example, FIG. 14A represents recorded data comprising variation of parameters only (altitude and airspeed) at $T_0+4$ seconds and $T_0+4.5$ seconds, and an action (actuate landing flaps) at $T_0+5$ seconds. The simulation metadata has a generic rule specifying that any variation of a parameter(s) not associated with an action or an event shall be removed. FIG. 14B illustrates the result of applying the simulation metadata to process the recorded data of FIG. 14A. The customized simulation data of FIG. 14B comprise the action "actuate landing flaps". The variation of parameters at $T_0+4$ seconds and $T_0+4.5$ seconds have been removed, while the variation of parameters at $T_0+5$ seconds have been kept since they are associated with the action.

The simulation metadata may also include specific rule(s) for renaming at least one recorded datum. The renaming rule(s) may apply to any subset of the actions, events or variation of parameter(s) present in the recorded data.

Figure 15A:
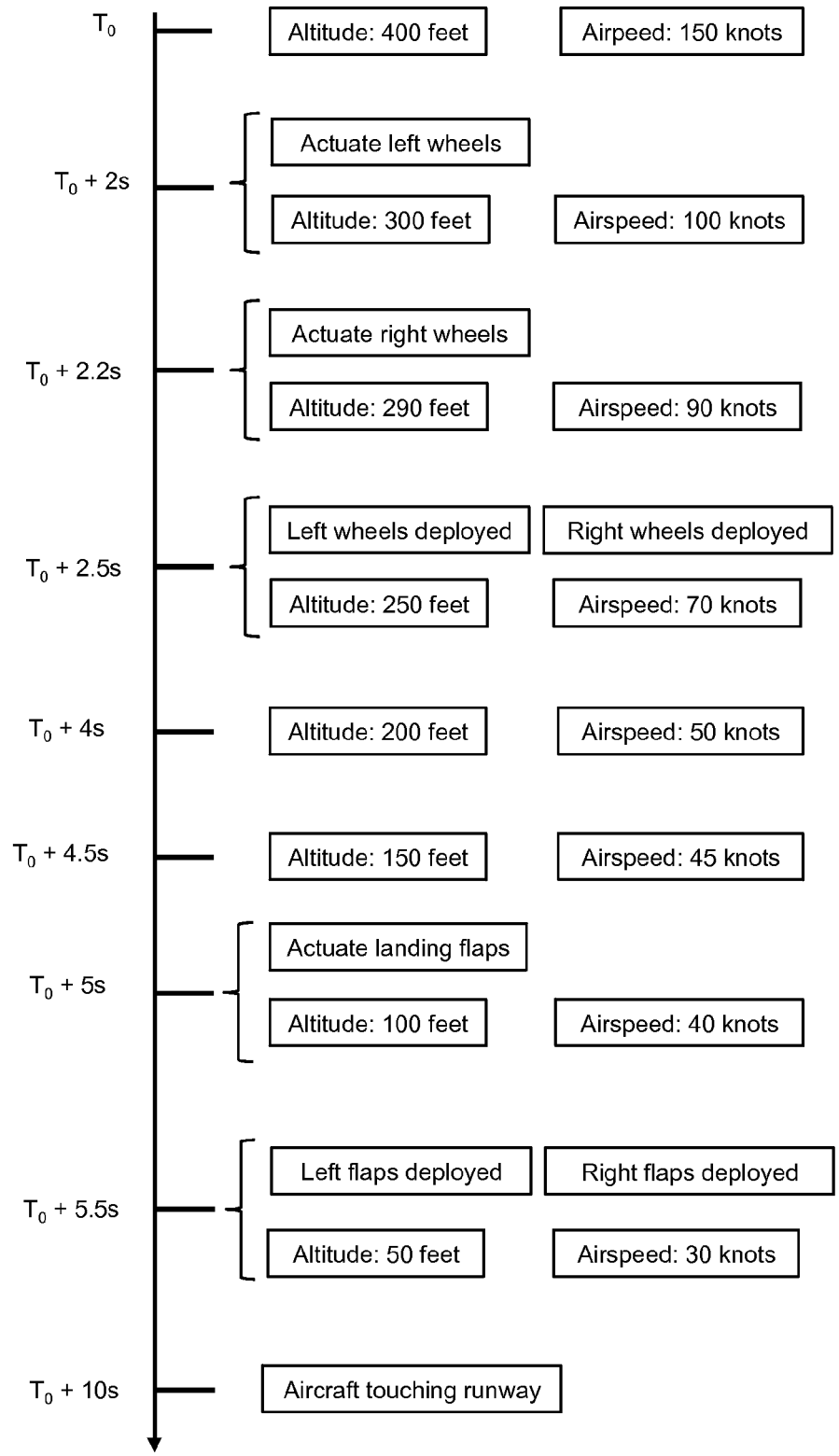
Figure 15B:
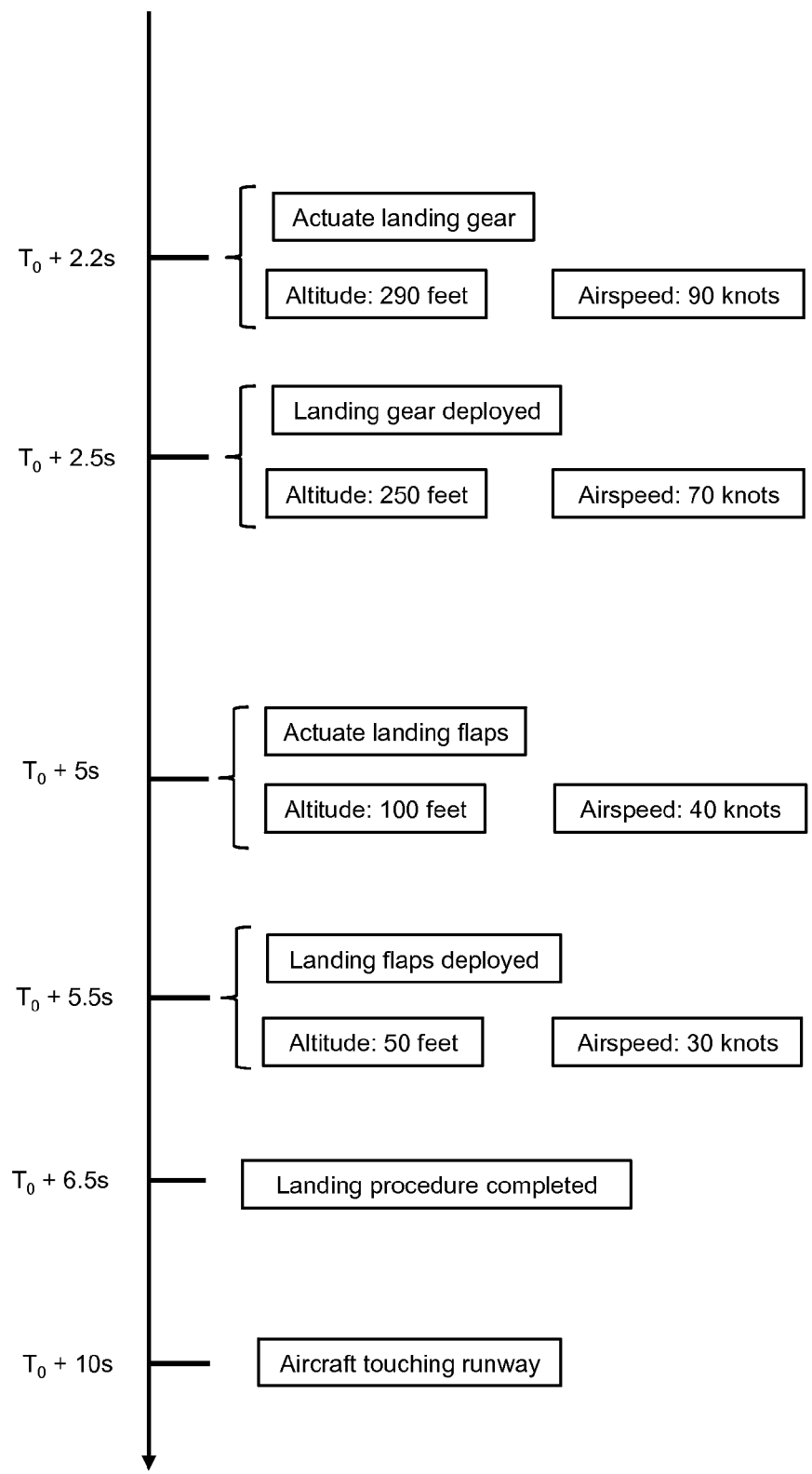

Referring now to FIGS. 15A and 15B, the aforementioned principles for generating customized simulation data based on simulation metadata are illustrated for a more complete set of recorded data represented in FIG. 15A. The recorded data of FIG. 15A are similar to those of FIG. 5, but have been slightly adapted to better illustrate the application of the simulation metadata to the recorded data. FIG. 15B represents the customized simulation data obtained when applying the simulation metadata to the recorded data of FIG. 15A.

A new event "landing procedure completed" has been added in FIG. 15B, corresponding to a new time reference $T_0+6.5$ seconds which has been added to the updated simulation timeline. This update is performed automatically based on simulation metadata specifying that this event shall be added 1 second after both events "landing gear deployed" and "landing flaps deployed" have occurred. This example illustrates an operational mode where the recorded data are processed in a recursive way. In a first step, preliminary customized simulation data are generated by pre-processing the recorded data. The preliminary customized simulation data contain the events "landing gear deployed" and "landing flaps deployed", but not yet the new event "landing procedure completed". In a second step, final customized simulation data are generated by post-processing the preliminary customized simulation data. The final customized simulation data contain the events "landing gear deployed" and "landing flaps deployed", and the new event "landing procedure completed".

The simulation metadata may include specific rule(s) involving several types of recorded data in combination. For example, the generation of a new event (e.g. landing gear deployed at $T_0+2.5$ seconds in FIG. 15B) may not only depend on the presence of specific events in the recorded data (e.g. left wheels deployed and right wheels deployed at $T_0+2.5$ seconds in FIG. 15A), but also on the presence of specific actions in the recorded data (e.g. actuate left wheels and actuate right wheels respectively at $T_0+2$ seconds and $T_0+2.2$ seconds in FIG. 15A). Furthermore, the new event "landing gear deployed" at $T_0+2.5$ seconds can replace all the aforementioned actions and events. In this case, the action "actuate landing gear" at $T_0+2.2$ seconds would not be present in the updated simulation timeline of FIG. 15B. This example illustrates a simulation template aimed at drastically simplifying the recorded data, in order to be capable of easily generating a corresponding simplified interactive training scenario (e.g. to target trainees at an early stage of their training, for whom too many details would be confusing).

FIGS. 15A and 15B illustrate the flexibility provided by the simulation metadata, to automatically customize recorded data generated by a simulator. For instance, the recording of simulation data by a legacy simulator may not be modified. Furthermore, the recorded data generated by the legacy simulator may not be adapted to generate interactive training scenarios, thus requiring a large amount of user interactions to obtain satisfying interactive training scenarios based on the recorded data. The automatic pre-processing of the recorded data based on the simulation metadata to generate the customized simulation data provides an effective way of further generating interactive training scenarios, without requiring too much user intervention, and without modifying the recording of data implemented by the legacy simulator.

Referring back to FIGS. 2, 3, 10 and 11, the simulation metadata can be customized to support various types or versions of simulators, each particular simulator generating a specific set of recorded data. Thus, there is a specific set of simulation metadata adapted to customize each specific set of recorded data generated by a particular simulator. Furthermore, the same software implementing step 125 of the method 100 (generation of the interactive training scenarios) can support the plurality of types of versions of simulators generating heterogeneous recorded data, through the use of adapted simulation metadata at step 112 (customization of the recorded data) of the method 100.

The simulation metadata may be generated at the device implementing step 112 of the method 100, for instance the simulator 400 in the embodiment represented in FIG. 10 and the computing device 200 in the embodiment represented in FIG. 8. Alternatively, the simulation metadata are generated at a third party device not represented in the Figures, and transmitted over the network 300 to the simulator 400 in the embodiment represented in FIG. 10 (reception via the communication interface 430 and storage in the memory 420) and to the computing device 200 (reception via the communication interface 230 and storage in the memory 220) in the embodiment represented in FIG. 8.

The simulation metadata may have a proprietary format or a standardized format, such as the Extensible Markup Language (XML), etc. Furthermore, the specification by the simulation metadata of how the recorded data shall be processed to generate the customized simulation data can be expressed in a programming or scripting language, as is well known in the art. Such languages generally use Boolean and conditional expressions for defining one or several actions to be performed, based on the occurrence of specific condition(s). The actions can consist in replacing one or several data by one or several new data, removing one or more data, creating one or more new data, etc.

Although the present disclosure has been described hereinabove by way of non-restrictive, illustrative embodiments thereof, these embodiments may be modified at will within the scope of the appended claims without departing from the spirit and nature of the present disclosure.

What is claimed is:

1. A method for customizing a recorded real time simulation based on simulation metadata, the method comprising:

recording data corresponding to an execution of a real time simulation on a real time simulator, the recorded data being organized according to an original simulation timeline, the recorded data comprising: at least one action performed by a user interacting with the real time simulation, at least one event occurring during the real time simulation and at least one variation of a parameter during the real time simulation; and processing by a processing unit of a computing device the recorded data to automatically generate customized simulation data based on the simulation metadata, the customized simulation data comprising at least some of the recorded data and being organized according to an updated simulation timeline, the updated simulation timeline being generated based on the original simulation timeline.

2. The method of claim 1, wherein generating the customized simulation data based on the simulation metadata comprises generating a new datum corresponding to a plurality of recorded data according to the simulation metadata.

3. The method of claim 2, wherein the plurality of recorded data is replaced by the new datum in the customized simulation data.

4. The method of claim 2, wherein the recorded data comprise a plurality of actions performed by a user interacting with the real time simulation, and generating the customized simulation data based on the simulation metadata comprises generating a new action corresponding to the plurality of actions according to the simulation metadata.

5. The method of claim 4, wherein the plurality of actions is replaced by the new action in the customized simulation data.

6. The method of claim 2, wherein the recorded data comprise a plurality of events occurring during the real time simulation, and generating the customized simulation data based on the simulation metadata comprises generating a new event corresponding to the plurality of events according to the simulation metadata.

7. The method of claim 6, wherein the plurality of events is replaced by the new event in the customized simulation data.

8. The method of claim 1, wherein generating the customized simulation data based on the simulation metadata comprises one of the following: removing at least one recorded datum according to the simulation metadata, and renaming at least one recorded datum according to the simulation metadata.

9. The method of claim 8, wherein the recorded data comprise a variation of a parameter during the real time simulation, and generating the customized simulation data based on the simulation metadata comprises removing the variation of the parameter according to the simulation metadata.

10. The method of claim 1, wherein the simulation metadata comprise a plurality of templates, and the customized simulation data are generated based on a particular template selected among the plurality of templates.

11. The method of claim 1, comprising executing the real time simulation on the real time simulator, by:
controlling the execution of the real time simulation via a processing unit of the simulator;
receiving interactions from a user performing the real time simulation via a user interface of the simulator;
displaying information generated by the execution of the real time simulation on a display of the simulator; and
recording the data corresponding to the execution of the real time simulation by the processing unit of the simulator, the recorded data being organized according to the original simulation timeline.

12. A computer program product comprising instructions deliverable via an electronically-readable media, such as storage media and communication links, the instructions when executed by a processing unit of a computing device providing for customizing a recorded real time simulation based on simulation metadata by:

receiving recorded data corresponding to an execution of a real time simulation on a real time simulator, the recorded data being organized according to an original simulation timeline, the recorded data comprising: at least one action performed by a user interacting with the real time simulation, at least one event occurring during the real time simulation and at least one variation of a parameter during the real time simulation; and
processing by the processing unit the recorded data to automatically generate customized simulation data based on the simulation metadata, the customized simulation data comprising to at least some of the recorded data and being organized according to an updated simulation timeline, the updated simulation timeline being generated based on the original simulation timeline.

13. A system for customizing a recorded real time simulation based on simulation metadata, comprising:
a computing device comprising:
memory for:
storing the simulation metadata; and
a processing unit for:
receiving recorded data corresponding to an execution of a real time simulation on a real time simulator, the recorded data being organized according to an original simulation timeline, the recorded data comprising: at least one action performed by a user interacting with the real time simulation, at least one event occurring during the real time simulation and at least one variation of a parameter during the real time simulation; and
processing the recorded data to automatically generate customized simulation data based on the simulation metadata, the customized simulation data comprising at least some of the recorded data and being organized according to an updated simulation timeline, the updated simulation timeline being generated based on the original simulation timeline.

14. The system of claim 13, wherein generating the customized simulation data based on the simulation metadata comprises generating a new datum corresponding to a plurality of recorded data according to the simulation metadata.

15. The system of claim 14, wherein the plurality of recorded data is replaced by the new datum in the customized simulation data.

16. The system of claim 13, wherein generating the customized simulation data based on the simulation metadata comprises one of the following: removing at least one recorded datum according to the simulation metadata, and renaming at least one recorded datum according to the simulation metadata.

17. The system of claim 13, wherein the computing device is the real time simulator, and the processing unit further executes the real time simulation and records the recorded data corresponding to the execution of the real time simulation.

18. The system of claim 13, further comprising the real time simulator having a processing unit for executing the real time simulation and recording the recorded data corresponding to the execution of the real time simulation; and wherein the computing device further comprises a communication interface for receiving the recorded data from the real time simulator.

* * * * *